(12) United States Patent
Jeon et al.

(10) Patent No.: US 12,323,144 B2
(45) Date of Patent: Jun. 3, 2025

(54) INTERFACE DEVICE AND METHOD OF OPERATING THE SAME

(71) Applicant: SK hynix Inc., Gyeonggi-do (KR)

(72) Inventors: Yong Tae Jeon, Gyeonggi-do (KR); Ki Chul Noh, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/958,554

(22) Filed: Oct. 3, 2022

(65) Prior Publication Data

US 2023/0318606 A1 Oct. 5, 2023

(30) Foreign Application Priority Data

Apr. 1, 2022 (KR) .......................... 10-2022-0040867

(51) Int. Cl.
| | |
|---|---|
| *H03K 19/17* | (2006.01) |
| *G06F 13/36* | (2006.01) |
| *G06F 13/364* | (2006.01) |
| *G06F 13/42* | (2006.01) |
| *H03K 19/173* | (2006.01) |
| *H03K 19/17728* | (2020.01) |

(52) U.S. Cl.
CPC ....... *H03K 19/1737* (2013.01); *G06F 13/364* (2013.01); *G06F 13/4221* (2013.01); *H03K 19/17728* (2013.01)

(58) Field of Classification Search
CPC .......... H03K 19/1737; H03K 19/17728; G06F 13/364; G06F 13/4221
See application file for complete search history.

(56) References Cited

U.S. PATENT DOCUMENTS

| | | | |
|---|---|---|---|
| 8,065,454 B1* | 11/2011 | Sonksen ............... | G06F 13/385 710/63 |
| 9,858,102 B2 | 1/2018 | Khemani et al. | |
| 2012/0054396 A1* | 3/2012 | Bhattacharya ........ | G06F 13/385 718/1 |
| 2012/0096192 A1* | 4/2012 | Tanaka .................. | G06F 13/385 710/20 |
| 2014/0006675 A1* | 1/2014 | Meir .................... | G06F 11/0745 710/314 |
| 2016/0188510 A1* | 6/2016 | Singh .................. | G06F 13/4068 710/105 |
| 2017/0262380 A1* | 9/2017 | Yoshida ............... | G06F 13/4068 |
| 2018/0052793 A1* | 2/2018 | Fang ................. | H04L 41/0806 |
| 2021/0019085 A1* | 1/2021 | Zhu ..................... | G06F 13/4282 |

FOREIGN PATENT DOCUMENTS

| | | |
|---|---|---|
| KR | 10-2016-0016557 A | 2/2016 |
| KR | 10-2021-0000268 A | 1/2021 |

* cited by examiner

*Primary Examiner* — Henry Tsai
*Assistant Examiner* — Harry Z Wang
(74) *Attorney, Agent, or Firm* — IP & T GROUP LLP

(57) ABSTRACT

Provided herein may be an interface device and a method of operating the same. The interface device may include a first port configured to enable communication with a host, a second port configured to enable communication with the host, and a function manager including a plurality of variable functions that are selectively assignable to at least one of the first port and the second port.

16 Claims, 14 Drawing Sheets

INTERFACE DEVICE AND METHOD OF OPERATING THE SAME

CROSS-REFERENCE TO RELATED APPLICATION

The present application claims priority under 35 U.S.C. § 119 (a) to Korean patent application number 10-2022-0040867 filed on Apr. 1, 2022, the entire disclosure of which is incorporated by reference herein.

BACKGROUND

Field of Invention

Various embodiments of the present disclosure generally relate to an electronic device, and more particularly to an interface device and a method of operating the interface device.

Description of Related Art

Peripheral Component Interconnect (PCI) defines a bus protocol used to couple input/output devices to a host device. PCI Express (PCIe) follows the programming concepts defined in the PCI standard, and defines a physical communication layer as a high-speed serial interface.

A storage device is a device which stores data under the control of a host device such as a computer or a smartphone. The storage device may include a memory device in which data is stored and a memory controller which controls the memory device. Memory devices may be classified into a volatile memory device and a nonvolatile memory device.

The volatile memory device may be a memory device in which data is stored only when power is supplied and in which stored data is lost when the supply of power is interrupted. Examples of the volatile memory device may include a static random access memory (SRAM) and a dynamic random access memory (DRAM).

The nonvolatile memory device may be a memory device in which stored data is retained even when the supply of power is interrupted. Examples of the nonvolatile memory device may include a read only memory (ROM), a programmable ROM (PROM), an electrically programmable ROM (EPROM), an electrically erasable and programmable ROM (EEPROM), and a flash memory.

SUMMARY

Various embodiments of the present disclosure are directed to an interface device having a multi-port structure, which can efficiently use resources for functions corresponding to each port, and a method of operating the interface device.

An embodiment of the present disclosure may provide for an interface device. The interface device may include a first port configured to enable communication with a host, a second port configured to enable communication with the host, and a function manager including a plurality of variable functions that are selectively assignable to at least one of the first port and the second port.

In an embodiment, the function manager may include a multiplexer configured to couple one of the first port and the second port to the plurality of variable functions, a multiplexer controller configured to control an operation of the multiplexer, and a variable function group including the plurality of variable functions.

In an embodiment, the multiplexer controller may include a lookup table indicating information for identifying a relationship between at least one of the plurality of variable functions and an assigned port corresponding to the at least one variable function.

In an embodiment, the variable function group may include a configuration space including registers configured to form each of the plurality of variable functions.

In an embodiment, each of the registers included in the configuration space may include a field indicating port assignment information for a corresponding variable function of the variable function.

In an embodiment, the function manager may be configured to update port assignment information corresponding to an unassigned function, among the plurality of variable functions, to a value indicating an assigned port, and update the lookup table to indicate information for identifying a relationship between the unassigned function and the assigned port.

An embodiment of the present disclosure may provide for a method of operating an interface device for communicating a plurality of variable functions with a host through a plurality of ports. The method may include determining to assign an unassigned function, among the plurality of variable functions, to a selected port of the plurality of ports, assigning the unassigned function to the selected port in response to the determination, and controlling the assigned function to operate through the selected port.

In an embodiment, the interface device may include a configuration space including registers configured to form each of the plurality of variable functions, and the assigning of the unassigned function to the selected port may include updating port assignment information, which corresponds to the unassigned function and is included in the configuration space to a value indicating the selected port, and updating a lookup table indicating information for identifying a relationship between the unassigned function and the selected port.

In an embodiment, the controlling the assigned function to operate through the selected port may include identifying the assigned function and the selected port with reference to the lookup table, and coupling the selected port to the assigned function.

An embodiment of the present disclosure may provide for an operating method of an interface device. The method may include keeping relationship between one of a plurality of functions and one of a plurality of ports, the function and port being selected according to information from a host, and controlling, according to the relationship, the selected port to transfer a signal between the selected function and the host while controlling the selected function to operate in response to a request from the host.

DETAILED DESCRIPTION

Specific structural or functional descriptions of the embodiments of the present disclosure introduced in this specification are provided as examples to describe embodiments according to the concept of the present disclosure. The embodiments according to the concept of the present disclosure may be practiced in various forms, and should not be construed as being limited to the embodiments described in this specification.

Figure 1:
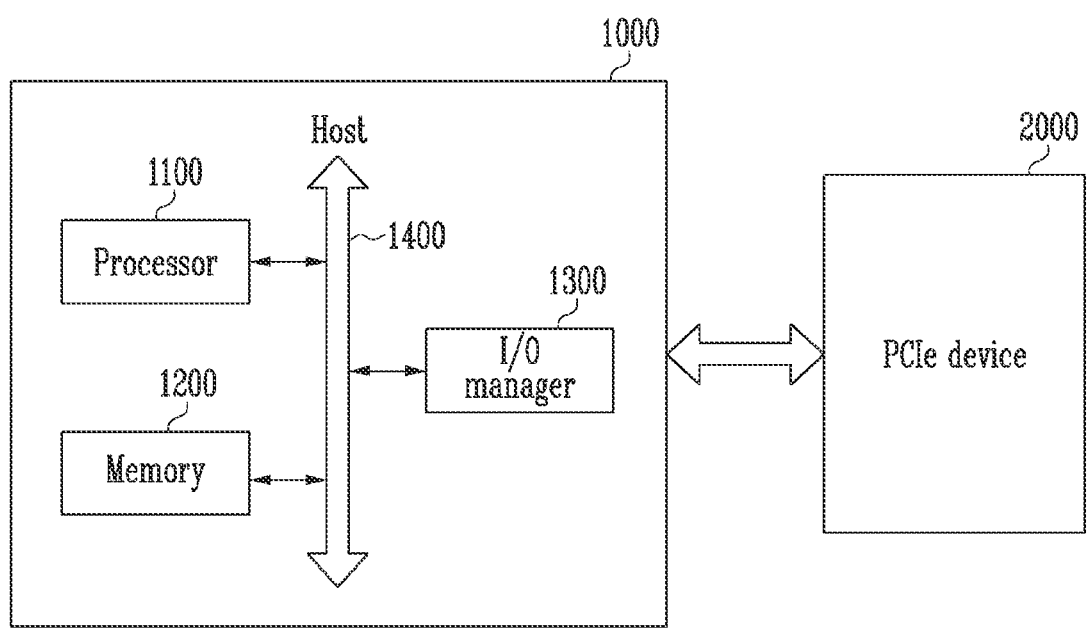
FIG. 1 is a diagram illustrating an example of a computing system according to an embodiment of the present disclosure.

FIG. 1 is a diagram illustrating an example of a computing system according to an embodiment of the present disclosure.

Referring to FIG. 1, a computing system 100 may include a host 1000 and a Peripheral Component Interconnect Express (PCIe) device 2000. For example, the computing system 100 may be a mobile phone, a smartphone, an MP3 player, a laptop computer, a desktop computer, a gaming console, a TV, a tablet PC, an in-vehicle infotainment system, or the like.

The host 1000 may include a processor 1100, a memory 1200, an input/output (I/O) manager 1300, and a bus 1400. The components in the host 1000 may exchange signals and data with each other through the bus 1400.

The processor 1100 may include circuits, interfaces or program code, which perform data processing and perform control on operations of the components of the computing system 100. For example, the processor 1100 may include a central processing unit (CPU), an advanced RISC machine (ARM), an application specific integrated circuit (ASIC), etc.

The memory 1200 may include an SRAM, a DRAM, or the like which stores data, commands or program code required for the operation of the computing system 100. Also, the memory 1200 may include a nonvolatile memory. In an embodiment, program code that is operable to execute one or more operating systems (OS) and virtual machines (VM), and program code that executes a virtualization intermediary (VI) for managing the virtual machines may also be stored in the memory 1200.

The processor 1100 may run one or more operating systems and virtual machines by executing the program code stored in the memory 1200. Further, the processor 1100 may run the virtualization intermediary for managing the virtual machines. In this way, the processor 1100 may control the operations of the components of the computing system 100.

The I/O manager 1300 may be an adapter configured to couple input/output devices to the host 1000. For example, the input/output (I/O) manager 1300 may include a universal serial bus (USB) adapter, a peripheral component interconnect (PCI) or PCI Express (PCIe) adapter, a small computer system interface (SCSI) adapter, a serial AT attachment (SATA) adapter, a nonvolatile memory express (NVMe) adapter, etc. The I/O manager 1300 may include circuits, interfaces or codes, which may function to communicate information with devices coupled to the computing system 100. The I/O manager 1300 may include one or more standardized buses and one or more bus controllers. Therefore, the I/O manager 1300 may perform operations of recognizing devices coupled to the bus 1400, enumerating the devices coupled to the bus 1400, and allocating and deallocating resources for various devices coupled to the bus 1400. That is, the I/O manager 1300 may function to manage communications on the bus 1400. For example, the I/O manager 1300 may be a PCI or PCIe system, and may include a PCIe root complex (RC), and one or more PCIe switches or bridges. For example, the I/O manager 1300 may also be controlled by the virtualization intermediary.

PCI defines a bus protocol used to couple the input/output devices to the processor 1100. PCIe follows the programming concepts defined in the PCI standard, and defines a physical communication layer as a high-speed serial interface.

The PCIe device 2000 may be an embodiment of an interface device communicating with the host 1000. That is, the PCIe device 2000 may be an interface device capable of communicating with the host 1000 using PCIe. For example, the PCIe device 2000 may be implemented in various I/O device types, such as a network and a storage.

In an embodiment, the PCIe device 2000 may be a device defined as an endpoint or a device including the endpoint.

The endpoint denotes the type of function, which may be a requester or completer of a PCIe transaction. The endpoint may be classified as a legacy endpoint, a PCIe endpoint, or a root complex integrated endpoint (RCIEP).

The legacy endpoint may be a function having a type 00h configuration space header. The legacy endpoint may support a configuration request as a completer. The legacy endpoint may support an I/O request as a completer. The legacy endpoint may accept I/O requests for either or both of 80h and 84h locations regardless of the I/O decoding configuration of the corresponding endpoint. The legacy endpoint may generate I/O requests. The legacy endpoint should not issue a locked request. The legacy endpoint may implement extended configuration space capabilities. A legacy endpoint functioning as a requester of a memory transaction is not required to generate addresses above (or equal to) 4 GB. When an interrupt resource is requested, the legacy endpoint is required in order to support either or both of Message Signaled Interrupt (MSI) and MSI-X. When a message signaled interrupt (MSI) is implemented, the legacy endpoint may support 32-bit or 64-bit message address version of an MSI function structure. The legacy endpoint may support 32-bit addressing for a base address register which requests memory resources. The legacy endpoint may appear in any one of hierarchy domains originated by a root complex.

The PCIe endpoint may be a function having a type 00h configuration space header. The PCIe endpoint may support a configuration request as a completer. The PCIe endpoint should not depend on the allocation of I/O resources, requested through a Base Address Register (BAR), by an operating system (OS). The PCIe endpoint cannot generate an I/O request. The PCIe endpoint can neither support a locked request as a completer nor generate a locked request as a requester. A PCIe-compatible software driver and application may be created such that, when accessing the PCIe endpoint, locked semantics are not used. The PCIe endpoint, functioning as a requester of a memory transaction, may generate addresses above 4 GB. When an interrupt resource is requested, the PCIe endpoint may be required in order to support either or both of Message Signaled Interrupt (MSI) and MSI-X. When MSI is implemented, the PCIe endpoint may support 64-bit message address version of an MSI function structure. A minimum memory address range requested by the base address register may be 128 bytes. The PCIe endpoint may appear in any one of hierarchy domains originated by a root complex.

A Root Complex Integrated Endpoint (RCIEP) may be implemented in internal logic of the root complex including a root port. The RCIEP may be a function having a type 00h configuration space header. The RCIEP may support a configuration request as a completer. The RCIEP may not require I/O resources requested through the base address register. The RCIEP may not generate I/O requests. The RCIEP can neither support a locked request as a completer nor generate a locked request as a requester. A PCIe-compatible software driver and application may be created such that, when accessing the RCIEP, locked semantics are not used. The RCIEP, functioning as a requester of a memory transaction, may generate addresses having capacity equal to or greater than that of addresses that can be processed by the host 1000 as a completer. When an interrupt resource is requested, the RCIEP is required in order to support either or both of MSI and MSI-X. When MSI is implemented, the RCIEP is allowed to support a 32-bit or 64-bit message address version of an MSI function structure. The RCIEP may support 32-bit addressing for a base address register which requests memory resources. The RCIEP cannot implement link capabilities, link status, link control, link capabilities 2, link status 2, and link control 2 registers in PCI express extended capability. The RCIEP may not implement active status power management. The RCIEP may not be entirely and independently hot-plugged with a root complex. The RCIEP may not appear in hierarchy domains exposed by the root complex. The RCIEP may not appear in switches.

In an embodiment, the PCIe device 2000 may generate one or more virtual devices. For example, the PCIe device 2000 may store program code for generating one or more virtual devices.

In an embodiment, the PCIe device 2000 may generate a physical function (PF) device or a virtual function (VF) device based on a virtualization request received from the host 1000. For example, the physical function device may be set to a virtual device to which access rights are assigned to a virtualization intermediary of the host 1000. The virtual function device may be set to a virtual device allocated to a virtual machine of the host 1000.

Figure 2:
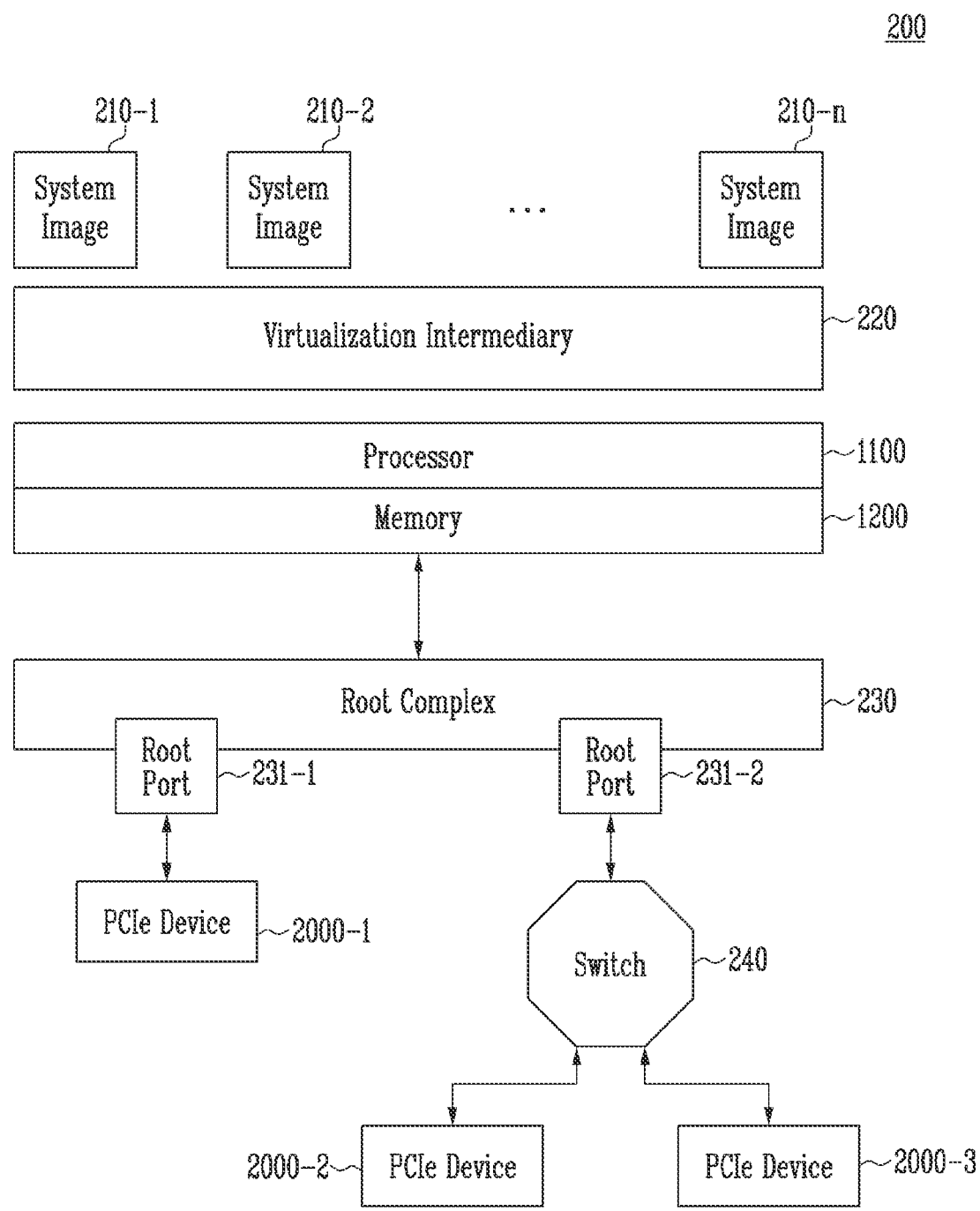
FIG. 2 is a diagram illustrating an example of a computing system according to an embodiment of the present disclosure.

FIG. 2 is a diagram illustrating an example of a computing system according to an embodiment of the present disclosure.

In an embodiment, FIG. 2 illustrates an example of configuration of a normal PCIe capable platform.

Referring to FIG. 2, a computing system 200 may include a processor 1100, a memory 1200, a plurality of system images 210-1 to 210-n, a virtualization intermediary 220, a root complex 230, a switch 240, and a plurality of PCIe devices 2000-1 to 2000-3.

The processor 1100 and the memory 1200 illustrated in FIG. 2 may be the processor 1100 and the memory 1200 illustrated in FIG. 1. In an embodiment, the processor 1100, the memory 1200, the plurality of system images 210-1 to 210-n, the virtualization intermediary 220, the root complex 230, and the switch 240 may be components included in the host 1000 of FIG. 1. In an embodiment, each of the plurality of PCIe devices 2000-1 to 2000-3 may be the PCIe device 2000 of FIG. 1.

The system images 210-1 to 210-n may be software components executed on a virtual system to which PCIe functions may be assigned. The system images 210-1 to 210-n may be software such as an operating system used to execute applications or trusted services. For example, each of the system images 210-1 to 210-n may be implemented as a guest operating system (Guest OS), a shared or non-shared I/O device driver, or the like. In order to realize effective hardware resource utilization without modification of hardware, the plurality of system images 210-1 to 210-n may run on the computing system 200.

In an embodiment, a PCIe function may be an independent operation unit, which provides physical resources included in the PCIe devices 2000-1 to 2000-3. In the present specification, the term "PCIe function" and the term "function" may have the same meaning.

The virtualization intermediary 220 may be a software component that supports the one or more system images 210-1 to 210-n. In an embodiment, the virtualization intermediary 220 may be referred to as a hypervisor or a virtual machine monitor (VMM). The virtualization intermediary 220 may be interposed between hardware, such as the processor 1100 and the memory 1200, and the system images 210-1 to 210-n. Input/output (I/O) operations (inbound or outbound I/O operations) in the computing system 200 may be intercepted and processed by the virtualization intermediary 220. The virtualization intermediary 220 may abstract hardware resources and present respective system images 210-1 to 210-n having respective virtual systems of the hardware resources. The actual hardware resources that are available in respective system images 210-1 to 210-n may vary with a workload or customer-specific policies.

The root complex 230 indicates the root of an I/O hierarchy which couples subsystems for the processor 1100/ memory 1200 to I/O. In an embodiment, the root complex 230 may be implemented as one component of the I/O manager 1300 illustrated in FIG. 1.

The computing system 200 may include one or more root complexes 230. Further, each root complex 230 may include one or more root ports 231-1 and 231-1. The root ports 231-1 and 231-2 denote separate hierarchies. The root complex 230 may communicate with the switch 240 or the PCIe devices 2000-1 to 2000-3 through the root ports 231-1 and 231-2.

A function of routing a peer-to-peer transaction between hierarchy domains through the root complex 230 may be optional. Each hierarchy domain may be implemented as a sub-hierarchy including either a single endpoint or one or more switches and an endpoint.

The root complex 230 may split a packet into smaller packets when routing a peer-to-peer transaction between hierarchy domains. For example, the root complex 230 may split a single packet having a 256-byte payload into two packets, each having a 128-byte payload. The exception to this is that the root complex 230, which supports peer-to-peer routing of vendor-defined messages, is not allowed to split vendor-defined message packets into smaller packets except at 128-byte boundaries (i.e., every resulting packet except the last packet needs to have a payload size that is an integer multiple of 128 bytes).

The root complex 230 needs to support the generation of a configuration request as a requester. The root complex 230 may support the generation of an I/O request as a requester.

The root complex 230 should not support lock semantics as a completer. The root complex 230 may support the generation of a locked request as a requester.

The switch 240 may be defined as a logical assembly of various virtual PCI-PCI bridge devices. The switch 240 may communicate with the PCIe devices 2000-2 and 2000-3 coupled thereto.

The switch 240 is indicated by two or more logical PCI-PCI bridges in configuration software.

The switch 240 may transfer transactions using a PCI bridge mechanism. The switch 240 may transfer all types of transaction layer packets (TLP) between all port sets. The switch 240 may support a locked request.

The switch 240 cannot split a packet into smaller packets.

Arbitration between ingress ports of the switch 240 may be implemented in a round robin or weighted round robin manner when contention occurs in the same virtual channel.

The endpoint should not be represented in configuration software in an internal bus of the switch 240, as a peer in a virtual PCI-PCI bridge indicating a switch downstream port.

Figure 3:
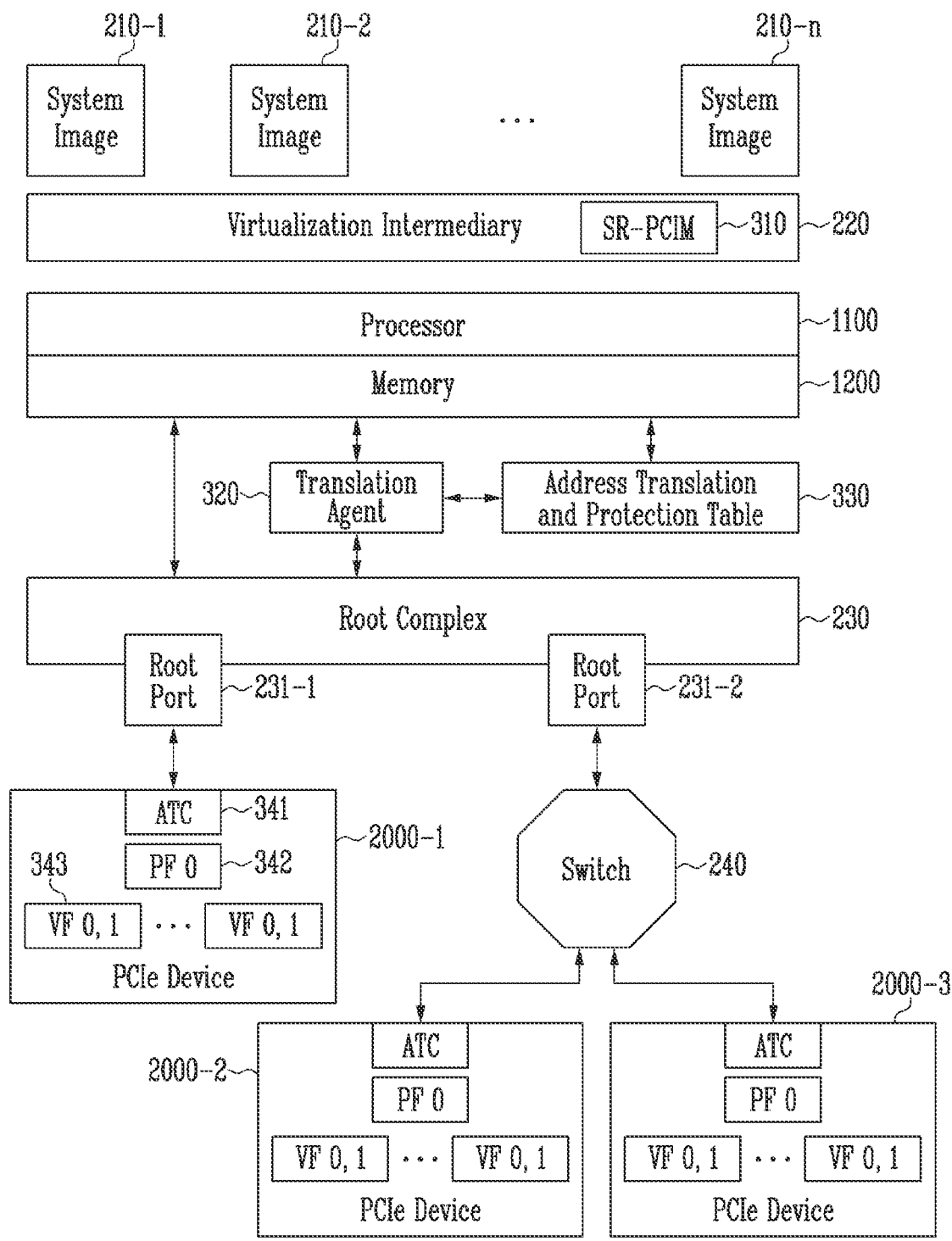
FIG. 3 is a diagram illustrating an example of a computing system according to an embodiment of the present disclosure.

FIG. 3 is a diagram illustrating an example of a computing system according to an embodiment of the present disclosure.

In an embodiment, FIG. 3 illustrates an example of single-root I/O Virtualization (SR-IOV) configuration platform.

SR-IOV is technology for allowing system images 210-1 to 210-n to share PCIe hardware resources in a virtualization environment. In an embodiment, SR-IOV is developed to improve the I/O performance of PCIe devices 2000-1 to 2000-3, and is capable of performing an operation of directly coupling the system images 210-1 to 210-n to the PCIe devices 2000-1 to 2000-3. Accordingly, in a computing system 300 including SR-IOV capabilities, at least one of the PCIe devices 2000-1 to 2000-3 or at least one PCIe function may be assigned to one of the system images 210-1 to 210-n. In an embodiment, SR-IOV capabilities may have specifications enabling a single PCIe device (each of 2000-1 to 2000-3) to be indicated as several individual PCIe devices 2000-1 to 2000-3 in the system images 210-1 to 210-n below a single-root port. In an embodiment, each of the PCIe devices 2000-1 to 2000-3 supporting SR-IOV capabilities may indicate several instances thereof, that is, PCI functions, in the system images 210-1 to 210-n. Further, in the computing system 300 to which SR-IOV capabilities are applied, the root complex 230 may directly couple the system images 210-1 to 210-n to the PCI functions without intervention of the virtualization intermediary 220. Therefore, the system images 210-1 to 210-n of the host 1000 may be directly coupled to PCI functions without intervention of the virtualization intermediary 220 by utilizing SR-IOV capabilities.

Referring to FIG. 3, the computing system 300 may include a processor 1100, a memory 1200, the plurality of system images 210-1 to 210-n, the virtualization intermediary 220, the root complex 230, a switch 240, a single-root PCI manager (SR-PCIM) 310, a translation agent (TA) 320, an address translation and protection table (ATPT) 330, and the plurality of PCIe devices 2000-1 to 2000-3.

In detail, the computing system 300 illustrated in FIG. 3 may further include the single-root PCI manager 310, the translation agent 320, and the address translation and protection table 330 in addition to the components illustrated in FIG. 2.

The plurality of PCIe devices 2000-1 to 2000-3 of FIG. 3 may indicate the plurality of PCIe devices 2000-1 to 2000-3 of FIG. 2. Also, each of the PCIe devices 2000-1 to 2000-3 may include an address translation cache (ATC) 341, a physical function (PF) 342, and a plurality of virtual functions (VF) 343. Although a single physical function is illustrated in FIG. 3 for convenience of description, a plurality of physical functions may be implemented in an embodiment.

The single-root PCI manager 310 may include software, which takes charge of the overall device control such as the configuration of SR-IOV capabilities, management of the physical function 342 and the virtual functions 343, processing of related error events, power management, and provision of a hot plug service. In an embodiment, the single-root PCI manager 310 may be logically disposed on a layer of the virtualization intermediary 220.

The translation agent 320 may be hardware, which translates addresses in PCIe transactions into physical addresses in related platforms, or a combination of hardware and software. The translation agent 320 may include an address translation cache for accelerating translation table access. Also, the translation agent 320 may support address translation services (ATS) so that PCIe functions may obtain address translation for direct memory access (DMA) to a related memory in advance. In SR-IOV implementation, the use of the translation agent 320 may be optional.

The address translation and protection table 330 may include an address translation set accessed by the translation agent 320 so as to process a PCIe request (e.g., a DMA read, DMA write, or interrupt request). In PCIe, an interrupt may be processed as a memory write operation. Through a combination of addresses included in a requester identifier and a PCIe transaction, the interrupt may be routed to any target (e.g., a processor core) in a related I/O function. The DMA read and write requests may be translated through a combination of a routing ID and an address, which are included in a PCIe transaction. In SR-IOV implementation, the use of the address translation and protection table 330 may be optional.

The address translation cache 341 may be disposed at two locations in a platform. For example, the address translation cache 341 may be integrated with the translation agent 320, may be disposed in the root complex (RC), or may be located in the PCIe devices 2000-1 to 2000-3. In each of the PCIe devices 2000-1 to 2000-3, the address translation cache 341 may be populated through address translation service (ATS) technology. A PCIe transaction indicating that a translated address is included may bypass the address translation cache 341 of the platform in order to improve performance without compromising advantages related to technology for the address translation and protection table 330. The use of the address translation cache 341 may be optional in SR-IOV implementation.

The physical function 342 may be a PCIe function which may support SR-IOV capabilities and may access the single-root PCI manager 310, the virtualization intermediary 220 or the system images 210-1 to 210-n.

The virtual functions 343 may be lightweight PCIe functions that may be directly accessed by system images (SI). Because the virtual functions 343 are operated as virtual instances for the physical function 342, the virtual functions 343 may appear as instances of the physical function 342 from the standpoint of the system images 210-1 to 210-n. Resources related to at least the main data movement of each function may be used by the system images 210-1 to 210-n. The virtual functions 343 may be shared in series by different system images 210-1 to 210-n. For example, each virtual function 343 may be reset after being assigned to one of the system images 210-1 to 210-n, and may be assigned to another of the system images 210-1 to 210-n. Each virtual function 343 may selectively migrate from one physical function 342 to another system function. All virtual functions 343 associated with the physical function 342 need to be of the same type as the physical function 342 (e.g., the same network device type or the same storage device type).

Figure 4:
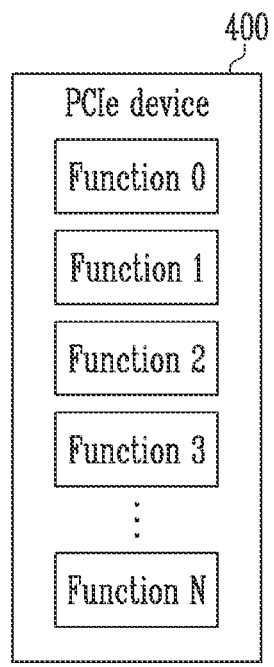
FIG. 4 is a diagram illustrating a multi-function device according to an embodiment of the present disclosure.

FIG. 4 is a diagram illustrating a multi-function device according to an embodiment of the present disclosure.

A PCIe device 400 illustrated in FIG. 4 may indicate the PCIe device 2000 illustrated in FIG. 1 or one of the PCIe devices 2000-1 to 2000-3 illustrated in FIGS. 2 and 3.

Referring to FIG. 4, the PCIe device 400 may include a plurality of functions Function 0 to Function N. In an embodiment, the plurality of functions Function 0 to Function N may be physical functions. Here, when all functions Function 0 to Function N included in the PCIe device 400 are physical functions, the corresponding PCIe device 400 may be defined as a multi-function device.

In an embodiment, the plurality of functions Function 0 to Function N may share a common PCIe link with each other. Links and PCIe functionality, functionally shared by all functions Function 0 to Function N, may be managed through function 0 (Function 0).

In an embodiment, the plurality of functions Function 0 to Function N may support an alternative routing identifier (ARI) capability. Also, each of the plurality of functions Function 0 to Function N may use a single bus number (Bus Number) captured through a PCI enumeration process.

In an embodiment, the plurality of functions Function 0 to Function N may support ATS capability. In this case, the plurality of functions Function 0 to Function N may include an address translation cache to manage translated addresses obtained through the ATS.

In an embodiment, the plurality of functions Function 0 to Function N may include inherent physical resources including a separate configuration space, a base address register (BAR), etc. Here, the physical resources may indicate some of physical resources of the PCIe device 400. That is, each of the plurality of functions Function 0 to Function N may provide physical resources to a system image assigned thereto.

Each of the plurality of functions Function 0 to Function N may be assigned to a system image. In order to prevent a system image from being influenced by other system images, all PCIe configuration operations may be intercepted and processed by the virtualization intermediary.

In an embodiment, the configuration space of the plurality of functions Function 0 to Function N may include a type 0 configuration space header. For example, the type 0 configuration space header may include a header type register, an interrupt pin register, etc.

The header type register may be included in the type 0 configuration space header of the configuration space. The header type register may identify whether multiple functions can be included in the layout of a second part of a predefined header (a part starting at 10h bytes in the configuration space) and in the PCIe device 400. For example, the header type register may include a multi-function device field of the header type register. When the multi-function device field is set, the PCIe device 400 may include the plurality of functions Function 0 to Function N. In this case, software may probe functions Function 1 to Function N, other than function 0 (Function 0).

The interrupt pin register may be a read-only register, which identifies a legacy interrupt message used by the corresponding function. Valid values may be 01h, 02h, 03h, and 04h mapped to legacy interrupt messages corresponding to INTA, INTB, INTC, and INTD, respectively. A value of 00h may indicate that the corresponding function does not use a legacy interrupt message. Values from 05h to FFh may be reserved. PCI Express may define one legacy interrupt message for a single function device, and may define a maximum of four legacy interrupt messages for a multi-function device. A single function device may use only INTA. All functions Function 0 to Function N of the multi-function device may use an INTx message. When a device implements a single legacy interrupt message, the message needs to be INTA. When the device implements two legacy interrupt messages, the legacy interrupt messages need to be INTA and INTB. In the case of the multi-function device, all functions Function 0 to Function N may have the same INTx message, or may have respective unique messages (for a maximum of four functions) or a combination thereof.

In an embodiment, the configuration space for the plurality of functions Function 0 to Function N may include a PCIe capability structure (i.e., PCI power capability structure). In an example, the PCIe capability structure may include a PCI Express capabilities register, a device capabilities register, a device control register, a device status register, a link capabilities register, a link control register, a link status register, a slot capabilities register, a slot control register, a slot status register, a root control register, a root capabilities register, a root status register, a device capabilities 2 register, a device control 2 register, a device status 2 register, a link capabilities 2 register, a link control 2 register, a link status 2 register, a slot capabilities 2 register, a slot control 2 register, a slot status 2 register, a root control 2 register, a root capabilities 2 register, a root status 2 register, etc.

The PCIe capabilities register may identify the function type of a PCIe device and associated capabilities. In an embodiment, the PCIe capabilities register may be a 16-bit register. Bits 0-3 of the PCIe capability register may be a capability version field. The capability version field may have a read-only property. In detail, the capability version field may indicate the version number of a PCI Express function structure defined in a PCI Special Internet Group (PCI-SIG). Bits 4-7 of the PCIe capabilities register may be a device/port type field. The device port/type field may have a read-only property. In detail, the device/port type field may indicate the specific type of function. In the device/port type field, functions of the multi-function device may indicate different types. Bit 8 of the PCIe capabilities register may be a slot-implemented field. The slot-implemented field may have a hardware initialized (HwInit) property. The case in which the slot-implemented field is set indicates that the link associated with this port is coupled to a slot. Bits 9-13 of the PCIe capabilities register may be an interrupt message number field. The interrupt message number field may have a read-only property. The interrupt message number field may indicate an MSI/MSI-X vector used for an interrupt message generated in relation to the status bit of a function structure. In the case of message signaled interrupts (MSI), the value of an interrupt message number field may indicate an offset between basic message data and a generated interrupt message. In the case of MSI-X, the value of the interrupt message number field may indicate an MSI-X table entry used to generate an interrupt message. When both MSI and MSI-X are implemented, software may enable only one mechanism at one time, but may use different vectors. For example, when MSI-X is enabled, the value of the interrupt message number field needs to indicate a vector for MSI-X. When MSI is enabled or when both MSI and MSI-X are disabled, the value of the interrupt message number field needs to indicate a vector for MSI. When MSI and MSI-X are simultaneously enabled, the value of the interrupt message number field is not defined. Bit 14 of the PCIe capabilities register has a read-only property and is not defined.

The device capabilities register may identify PCIe device function-specific capabilities. In an embodiment, the device capabilities register may be a 32-bit register. Bits 0-2 of the device capabilities register may be a max payload size supported field (Max_Payload_Size Supported). The max payload size supported field may have a read-only property. The max payload size supported field may indicate the maximum payload size that may be supported for TLPs by the function. The functions Function 0 to Function N of the multi-function device may have different values for this field. Bits 3-4 of the device capabilities register may be a phantom functions supported field. The phantom functions supported field may have a read-only property. The phantom functions supported field indicates the support for use of unclaimed function numbers to extend the number of outstanding transactions allowed by logically combining unclaimed function numbers with a tag identifier.

The device control register may control PCIe device specific parameters. In an embodiment, the device control register may be a 16-bit register. Bit 0 of the device control register may be a correctable error reporting enable field. The correctable error reporting enable field may control sending ERR_COR messages in conjunction with other bits. For the multi-function device, the correctable error reporting enable field may control error reporting for each of functions Function 0 to Function N from the point of-view of the respective function. The correctable error reporting enable field may have a read-write (RW) property. Bit 1 of the device control register may be a non-fatal error reporting enable field. The non-fatal error reporting enable field may control sending ERR_NONFATAL messages in conjunction with other bits. For the multi-function device, the non-fatal error reporting enable field may control error reporting for each of functions Function 0 to Function N from the point-of-view of the respective function Function 0 to Function N. The non-fatal error reporting enable field may have a read-write property. Bit 2 of the device control register may be a fatal error reporting enable field. The fatal error reporting enable field may control sending ERR_FATAL messages in conjunction with other bits. For the multi-function device, the fatal error reporting enable field may control error reporting for each of functions Function 0 to Function N from the point-of-view of the respective function Function 0 to Function N. The fatal error reporting enable field may have a read-write property. Bit 3 of the device control register may be an unsupported request reporting enable field. The unsupported request reporting enable field may control the signaling of unsupported requests by sending error messages in conjunction with other bits. For the multi-function device, the unsupported request reporting enable field may control error reporting for each of functions Function 0 to Function N from the point-of-view of the respective function Function 0 to Function N. The unsupported request reporting enable field may have a read-write property. Bits 5-7 of the device control register may be a max payload size (Max_Payload_Size) field. The max payload size field may set the maximum TLP payload size for each function. As a receiver, the function should not generate TLPs exceeding a set value. From the standpoint of the transmitter, permissible values that can be programmed may be indicated by the max payload size supported field in the function capabilities register. All functions Function 0 to Function N of the multi-function device may have different values for the max payload size field. For an ARI device, the max payload size field may be determined only by setting function 0. Set values for the max payload size field of other functions always return programmed software values, respectively, otherwise they may be ignored by components. The max payload size field may have a read-write property.

The device status register may provide information about PCIe device (function) specific parameters. In an embodiment, the device status register may be a 16-bit register. Bit 0 of the device status register may be a correctable error detected field. The correctable error detected field may indicate status of correctable errors detected. Errors may be logged in the correctable error detected field regardless of whether or not error reporting is enabled in the device control register. For the multi-function device, each of functions Function 0 to Function N may indicate status of errors as perceived by the respective function Function 0 to Function N. The correctable error detected field may have a Write-1-to-clear status (RW1C) property. Bit 1 of the device status register may be a non-fatal error detected field. The non-fatal error detected field may indicate status of non-fatal errors detected. Errors may be logged in the non-fatal error detected field regardless of whether error reporting is enabled or not in the device control register. For the multi-function device, each of functions Function 0 to Function N may indicate status of errors as perceived by the respective function Function 0 to Function N. The non-fatal error detected field may have a RW1C property. Bit 2 of the device status register may be a fatal error detected field. The fatal error detected field may indicate status of fatal errors detected. Errors may be logged in the fatal error detected field regardless of whether error reporting is enabled or not in the device control register. For the multi-function device, each of functions Function 0 to Function N may indicate status of errors as perceived by the respective function Function 0 to Function N. The fatal error detected field may have a RW1C property. Bit 3 of the device status register may be an unsupported request detected field. The unsupported request detected field may indicate that the function received an unsupported request. Errors may be logged in the unsupported request detected field regardless of whether error reporting is enabled or not in the device control register. For the multi-function device, each of functions Function 0 to Function N may indicate status of errors as perceived by the respective function Function 0 to Function N. The unsupported request detected field may have a RW1C property. Bit 6 of the device status register indicates an emergency power reduction detected field, and this field may be set when each of functions Function 0 to Function N is in an emergency power reduction state. Each of functions Function 0 to Function N may be maintained in an emergency power reduction state whenever a condition enabling an emergency power reduction state to be input is present. A multi-function device coupled to an upstream port needs to set the emergency power reduction detected field in all functions Function 0 to Function N supporting the emergency power reduction state. The emergency power reduction detected field may have a RW1C property.

The link capabilities register may identify a PCIe link specific capability. For the multi-function device, the field values of the link capabilities registers of all functions Function 0 to Function N may be equal to each other.

In an embodiment, the configuration space for the plurality of functions Function 0 to Function N may include message signaled interrupt (MSI) capability structures, secondary PCIe extended capability structures, data link feature extended capability structures, access control service (ACS) extended capability structures, etc. All functions Function 0 to Function N capable of generating interrupts may implement MSI or MSI-X.

Also, the configuration space for the plurality of functions Function 0 to Function N may include various registers related to the multi-function device in addition to the above-described registers.

In an embodiment, the plurality of functions Function 0 to Function N may perform an error processing operation. For example, the plurality of functions Function 0 to Function N may perform an error processing operation using advanced error reporting (AER). For example, when errors are detected, the plurality of functions Function 0 to Function N may indicate error status through a completion status field, send error messages to the root complex, or perform an error processing operation through error forwarding.

In an embodiment, the plurality of functions Function 0 to Function N may perform a function level reset (FLR) operation. For example, the plurality of functions Function 0 to Function N may perform a function level reset (FLR) operation in response to a request received from a host.

A function level reset mechanism allows software to suspend and reset endpoint hardware through function-level granularity.

Function level reset (FLR) may be applied to each of functions Function 0 to Function N. Only the target function, among Function 0 to Function N, may be influenced by the FLR operation. Link status may not be influenced by function level reset (FLR).

Function level reset (FLR) may correct the states of functions Function 0 to Function N.

For example, function registers and function-specific state machines may be set to initialization values of the function registers and function-specific state machines, except for the cases such as sticky-type registers (e.g., ROS, RWS, and RW1CS), registers defined as an HwInit type, or other fields or registers.

Further, function level reset may correct function states such as a captured slot power limit value of the device capabilities register, a captured slot power limit scale of the device capabilities register, the max payload size (Max_Payload_Size) of the device control register, active state power management (ASPM) control of the link control register, read completion boundary (RCB) of the link control register, common clock configuration of the link control register, extended synchronization (extended synch) of the link control register, enable clock power management of the link control register, hardware autonomous width disable of the link control register, hardware autonomous speed disable of the link control 2 register, link equalization 8.0 GT/s request of the link status 2 register, link equalization request 16.0 GT/s of a 16.0 GT/s status register, and function states of a lane equalization control register having a secondary PCI Express extended capability structure, a 16.0 GT/s lane equalization control register having a physical layer 16.0 GT/s extended capability structure, all registers having a virtual channel capability structure, all registers having a multi-function virtual channel capability structure, all registers having a data link feature extended capability structure, all registers having a physical layer 16.0 GT/s extended capability structure, and all registers in lane margining in a receiver extended capability structure.

Control for functions Function 0 to Function N that initiate requests for PCI Express, such as a bus master enable bit or an MSI enable bit, may be cleared, and thus the functions Function 0 to Function N in a link may be effectively suspended (become quiescent).

Port state machines related to link functionality, including physical and data link layers, may not be reset through a function level reset, and VC0 may be maintained in an initialized state according to the function level reset. Before a function level reset is initiated, all outstanding INTx interrupts asserted by functions Function 0 to Function N may be deasserted by sending the corresponding Deassert_INTx message.

When function level reset is initiated for the functions Function 0 to Function N of the PCIe device 400, a Deassert_INTx message may not be sent in the case where an additional function (any of Function 0 to Function N) continues to assert matching INTx.

After the function level reset is initiated by writing 1b to an initiate function level reset bit, the functions Function 0 to Function N may complete function level reset within a time of 100 ms. In the case where software initiates function level reset when a transaction pending bit is 1b, the computing system may not initialize functions Function 0 to Function N until an appropriate time during which related completion can arrive is permitted or until it is reasonably certain that the remaining completions will not arrive. For this operation, the computing system may permit the time, provided by a previous function level reset value, for a completion time limit. In the case where a completion timeout is disabled in functions Function 0 to Function N when a function level reset is issued, latency may be equal to or longer than 100 ms although there is a difference for each system. When function preparation status is implemented, the computing system may issue a configuration request to the functions Function 0 to Function N immediately after receiving a function level reset message indicating completion of configuration preparation.

When receiving the function level reset, the functions Function 0 to Function N may set completion timeout to a default value so that all transaction states including 'transactions pending' are erased or all pending transactions time out during execution of a function level reset. A 'transactions pending' bit may be erased when the function level reset is completed.

Because function level reset is configured to modify function status, the operation of the function level reset may be designated using a series of criteria indicating that the functions Function 0 to Function N have the function status. In order to evaluate the operation of the functions Function 0 to Function N as a response to the function level reset, the following criteria may be applied based on function-specific knowledge.

Each of functions Function 0 to Function N prevents an external interface controlled by the corresponding function (one of Function 0 to Function N) from providing appearance of an initialized adapter having an enabled host. However, the step required by the external interface to terminate actions may be exceptional. For example, a network adapter should not respond to a query that requires adapter initialization by a host system or interaction with an enabled host system, but may perform a task intended to be performed regardless of host initialization or interaction. When a plurality of functions Function 0 to Function N operating in the same external network interface are included in a network adapter, this rule may influence only aspects related to specific function resetting performed by function level reset.

Software readable status latently including secret information related to previous use of functions Function 0 to Function N cannot be maintained. A main host memory allocated to functions Function 0 to Function N cannot be modified by the functions Function 0 to Function N. For example, functions Function 0 to Function N in which an internal memory directly or indirectly readable by host software is present may erase or randomize the corresponding memory.

Functions Function 0 to Function N may return to the state in which a driver, generally associated with the functions Function 0 to Function N, is usable due to normal configuration of the PCIe interface of each of the functions Function 0 to Function N.

When function level reset is initiated, a targeted function (any of Function 0 to Function N) may be operated as follows.

The targeted function (any of Function 0 to Function N) may return completion of configuration writing at which a function level reset task is initiated, and thereafter may start a subsequent function level reset task.

When a request arrives while function level reset is being performed, the targeted function (any of Function 0 to Function N) may automatically discard the request without logging the request as an error or signaling the request after updating of flow control credit. Also, when completion arrives, the targeted function (any of Function 0 to Function N) may automatically discard the completion rather than processing the completion as unexpected completion, logging the completion as an error, or sending a signal.

Although the targeted function (any of Function 0 to Function N) needs to complete the function level reset task within a time limit, additional time may be required in an initialization sequence for an initialization sequence for each subsequent function. When a configuration request is received after the time limit in the case where additional time is required, the targeted function (any of Function 0 to Function N) may return a configuration request retry status (CRS) completion state. After responding to the configuration request in a completion state other than the CRS completion state, the targeted function (any of Function 0 to Function N) cannot return CRS until the corresponding function is reset.

Figure 5:
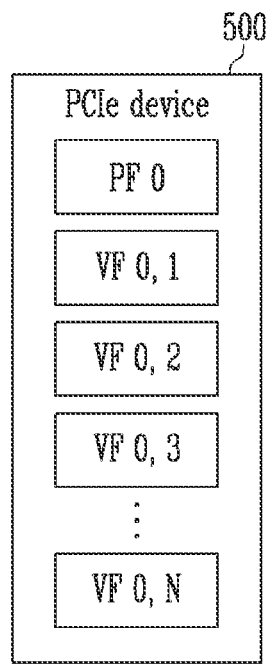
FIG. 5 is a diagram illustrating an example of a single-root I/O virtualization (SR-IOV) capable PCIe device according to an embodiment of the present disclosure.

FIG. 5 is a diagram illustrating an example of an SR-IOV capable PCIe device according to an embodiment of the present disclosure.

A PCIe device 500 illustrated in FIG. 5 may indicate the PCIe device 2000 illustrated in FIG. 1 or one of the PCIe devices 2000-1 to 2000-3 illustrated in FIGS. 2 and 3.

For example, FIG. 5 illustrates the PCIe device 500 to which SR-IOV capabilities are applied.

Referring to FIG. 5, the PCIe device 500 may include physical function 0 (PF 0) and a plurality of virtual functions VF 0, 1 to VF 0, N associated with physical function 0 (PF 0). Here, the virtual function 0, 1 (VF 0, 1) may indicate virtual function #1 associated with physical function 0 (PF 0). In the same manner, the virtual function 0, N (VF 0, N) may indicate virtual function #N associated with physical function 0 (PF 0). In an embodiment, a configuration space, a register setup scheme, an error processing operation, and a function level reset operation for physical function 0 (PFO), described above with reference to FIG. 4, may be applied to physical function 0 (PF 0).

Physical function 0 (PF 0) may support SR-IOV capabilities. In an embodiment, after the reset operation, physical function 0 (PF 0) may disable SR-IOV capabilities. In order to find page sizes supported by physical function 0 (PF 0) and the plurality of virtual functions VF 0, 1 to VF 0, N, a supported page sizes configuration field may be read.

The plurality of virtual functions VF 0, 1 to VF 0, N may share a plurality of common configuration space fields with physical function 0 (PF 0). Accordingly, hardware resource requirements for implementing the plurality of virtual functions VF 0, 1 to VF 0, N may be reduced. For example, the plurality of virtual functions VF 0, 1 to VF 0, N may use the same configuration mechanism and configuration header type as physical function 0 (PF 0). Also, the plurality of virtual functions VF 0, 1 to VF 0, N may share a VF BAR set with physical function 0 (PF 0). Also, the plurality of virtual functions VF 0, 1 to VF 0, N may share a VF memory space enable (MSE) bit for controlling access to a VF memory space with each other. That is, when the VF MSE bit is clear, memory mapped spaces allocated to all virtual functions VF 0, 1 to VF 0, N may be disabled.

InitialVFs and TotalVFs fields included in SR-IOV capabilities may be used to detect the maximum number of virtual functions that may be associated with physical function 0 (PF 0). For example, in the case where the PCIe device 500 does not support VF migration, TotalVFs and InitialVFs need to include the same value. On the other hand, in the case where the PCIe device 500 supports VF migration, physical function 0 (PF 0) needs to return the number of virtual functions that may be assigned to physical function 0 (PF 0) when TotalVFs are read. Further, when InitialVF is read, physical function 0 (PF 0) may return the number of initial virtual functions assigned to physical function (PF 0).

Unique routing IDs may be assigned to physical function 0 (PF 0) and the plurality of virtual functions VF 0, 1 to VF 0, N. The routing ID of each of the virtual functions VF 0, 1 to VF 0, N may be determined using the routing ID of physical function 0 (PF 0) and fields included in SR-IOV capabilities of physical function 0 (PF 0).

All PCIe and SR-IOV configuration accesses may be made through a trusted software component, such as a virtualization intermediary or a single-root PCI manager.

In an embodiment, physical function 0 (PF 0) and the plurality of virtual functions VF 0, 1 to VF 0, N may include physical resources including a configuration space. Each of the virtual functions VF 0, 1 to VF 0, N may include unshared physical resources (e.g., resources such as work queues and data buffers) required for providing function-specific services. These physical resources may be directly accessed by system images without intervention of the virtualization intermediary or the single-root PCI manager.

Also, one or more virtual functions VF 0, 1 to VF 0, N may be assigned to respective system images. Each of physical function 0 (PF 0) and the plurality of virtual functions VF 0, 1 to VF 0, N may include an address translation cache (ATC).

In an embodiment, physical function 0 (PF 0) may manage device-specific functionality such as allocation of internal resources to each of the virtual functions VF 0, 1 to VF 0, N, or VF arbitration for shared resources such as a PCIe link or a function-specific link (e.g., a network or storage link).

In an embodiment, the configuration space of physical function 0 (PF 0) may include an SR-IOV extended capability. For example, the SR-IOV extended capability may include an SR-IOV extended capability header register, an SR-IOV capabilities register, an SR-IOV control register, an SR-IOV status register, an InitialVFs register, a TotalVFs register, a NumVFs register, a function dependency link register, a first VF offset register, a VF stride register, a VF device ID register, a supported page size register, a system page size register, a VF base address (VF BAR0, VF BAR1, . . . . VF BAR5) register, a VF migration state array offset register, etc.

The SR-IOV control register may include a virtual function enable field.

The virtual function enable field may manage assignment of virtual functions VF 0, 1 to VF 0, N to physical function 0 (PF 0) associated therewith. When a virtual function enable bit is set, the virtual functions VF 0, 1 to VF 0, N associated with physical function 0 (PF 0) may be accessed by a PCI Express fabric. When the virtual function enable bit is set, the virtual functions VF 0, 1 to VF 0, N may respond to and issue PCI Express transactions based on the rules for PCI Express endpoint functions.

When the virtual function enable bit is clear, the virtual functions VF 0, 1 to VF 0, N may be disabled, and may not be indicated in the PCI Express fabric. Requests for such virtual functions VF 0, 1 to VF 0, N need to receive an unsupported request (UR), and the virtual functions VF 0, 1 to VF 0, N do not need to issue PCI Express transactions.

After the virtual function enable bit is changed from 'clear' to 'set' so that components are capable of performing internal initialization, the system cannot issue requests to the virtual functions VF 0, 1 to VF 0, N that are enabled by the corresponding virtual function enable bit until one of the following conditions is true. The conditions may include the case in which a time of at least 100 ms has elapsed, the case in which an FRS message, along with a reason code for 'VF enabled', is received from physical function 0 (PF 0), or the case in which a virtual function enable time has elapsed. Here, the virtual function enable time may be a reset time value in a readiness time reporting capability related to the virtual functions VF 0, 1 to VF 0, N, or may be a value determined by system software/firmware.

Before determining that virtual functions VF 0, 1 to VF 0, N, which did not return successful completion status for a valid configuration request, were damaged, the root complex and/or the system software may permit a time of at least 1.0 seconds after setting a virtual function enable bit. After the virtual function enable bit is set, when the virtual functions VF 0, 1 to VF 0, N, which are enabled by the virtual function enable bit, are not ready to provide successful completion status corresponding to the valid configuration request, the virtual functions VF 0, 1 to VF 0, N may return configuration request retry status (CRS) in response to the configuration request by a time limit of 1.0 seconds. After physical function 0 (PF 0) sends an FRS message, along with a reason code for 'virtual function enabled', the virtual functions VF 0, 1 to VF 0, N associated with the corresponding physical function 0 (PF 0), cannot return configuration request retry status (CRS) without an intervening VF disable condition or other valid reset conditions. After returning successful completion in response to the request, the virtual functions VF 0, 1 to VF 0, N cannot return CRS without an intervening VF disable condition or other valid reset conditions.

Because each of the virtual functions VF 0, 1 to VF 0, N does not have a memory space enable (MSE) bit (i.e., MSE is controlled by a VF MSE bit in the SR-IOV capability of physical function 0 (PF 0) within the virtual functions VF 0, 1 to VF 0, N), software may issue a memory request before the virtual functions VF 0, 1 to VF 0, N are ready to process the MSE bit. Therefore, until one of the following conditions is satisfied, the memory request cannot be issued to the virtual functions VF 0, 1 to VF 0, N.

The virtual functions VF 0, 1 to VF 0, N successfully respond to a configuration request (CRS is not returned).

After issuance of a function level reset (FLR) to the virtual functions VF 0, 1 to VF 0, N, (1) a time of at least 1.0 seconds has elapsed since issuance of FLR, (2) the virtual functions VF 0, 1 to VF 0, N support function readiness status (FRS), and an FRS message, along with a reason code for 'FLR completed', is received from the virtual functions VF 0, 1 to VF 0, N after issuance of the FLR, or (3) at least an FLR time has elapsed since issuance of the FLR. Here, the FLR time may be an FLR time value in a readiness time reporting capability associated with the virtual functions VF 0, 1 to VF 0, N, or may be a value determined by system software/firmware.

After physical function 0 (PF 0) sets a virtual function enable bit, (1) a time of at least 1.0 seconds has elapsed, (2) physical function 0 (PF 0) supports FRS, and an FRS message, along with a reason code for 'virtual function enabled', is received from physical function 0 (PF 0) after setting of the virtual function enable bit, or (3) at least a virtual function enable time has elapsed since setting of the virtual function enable bit. Here, the virtual function enable time may be a reset time value in the readiness time reporting capability associated with the virtual functions VF 0, 1 to VF 0, N, or may be a value determined by system software/firmware.

Until FLR is issued to the virtual functions VF 0, 1 to VF 0, N or until the virtual functions VF 0, 1 to VF 0, N successfully respond to all requests (without returning CRS), the virtual function enable bit may be set in the SR-IOV capability of the associated physical function 0 (PF 0), after which each of the virtual functions VF 0, 1 to VF 0, N may drop a memory request.

Clearing the virtual function enable bit may effectively destroy the virtual functions VF 0, 1 to VF 0, N. Setting the virtual function enable bit may effectively create the virtual functions VF 0, 1 to VF 0, N. Setting the virtual function enable bit after being previously cleared may create a set of new virtual functions VF 0, 1 to VF 0, N. When physical function 0 (PF 0) is in a D0 power state, the new virtual functions VF 0, 1 to VF 0, N may be in a D0$_{uninitialized}$ state. When physical function 0 (PF 0) is in a low-power state, operation may not be defined.

When the virtual function enable bit is cleared, physical function 0 (PF) supporting FRS may send an FRS message, along with an FRS reason VF disabled bit, in order to indicate that the corresponding task has been completed. When there are non-posted requests issued by physical function 0 (PF 0) or the virtual functions VF 0, 1 to VF 0, N associated with physical function 0 (PF 0), physical function 0 (PF 0) cannot send the FRS message. The FRS message may be sent only after the corresponding request has been completed or timeout occurs.

After the virtual function enable bit is cleared, SR-IOV extended capability or a VF migration state array field cannot be accessed until one of the following conditions is satisfied.

After the virtual function enable bit is cleared, a time of at least 1.0 seconds has elapsed.

Physical function 0 (PF 0) supports FRS, and an FRS message, along with a reason code for 'VF disabled', is received from physical function 0 (PF 0) after the virtual function enable bit is cleared.

An InitialVFs register may indicate the number of virtual functions VF 0, 1 to VF 0, N initially coupled to physical function 0 (PF 0) in the single-root PCI manager.

A TotalVFs register may indicate the maximum number of virtual functions VF 0, 1 to VF 0, N that can be associated with physical function 0 (PF 0).

A NumVF register may control the number of viewable virtual functions VF 0, 1 to VF 0, N.

A virtual function base address register may define the base address register of the virtual functions VF 0, 1 to VF 0, N. The virtual function base address register may be created as actual address values, and the base address register may map the actual address values to the NumVFs base address register (BAR) when the virtual function enable bit and the VF MSE bit are set.

In an embodiment, each of the configuration spaces for physical function 0 (PF 0) and the virtual functions VF 0, 1 to VF 0, N may include a type 0 configuration space header register, a PCIe capabilities register, a PCI standard capabilities register, a PCIe extended capability register, etc.

In an embodiment, register field values included in the configuration space for the virtual functions VF 0, 1 to VF 0, N may be dependent on or independent of register field values included in the configuration space for physical function 0 (PF 0). For example, when dependent on the register field values of the associated physical function 0 (PF 0), the register field values of the virtual functions VF 0, 1 to VF 0, N may be '0'. In this case, the virtual functions VF 0, 1 to VF 0, N may perform a configuration operation depending on the register field values of the associated physical function 0 (PF 0).

In an embodiment, the plurality of virtual functions VF 0, 1 to VF 0, N may perform an error processing operation. For example, when physical function 0 (PF 0) processes errors using advanced error reporting, the plurality of virtual functions VF 0, 1 to VF 0, N may also process errors using advanced error reporting.

In an embodiment, the plurality of virtual functions VF 0, 1 to VF 0, N may perform a reset operation.

For example, the plurality of virtual functions VF 0, 1 to VF 0, N may complete internal initialization when at least one of the following conditions is satisfied.

Each of the virtual functions VF 0, 1 to VF 0, N successfully responds to a configuration request (does not return CRS).

After issuance of function level reset to the virtual functions VF 0, 1 to VF 0, N, (1) a time of at least 1.0 seconds has elapsed, (2) a function level reset message is received from the virtual functions VF 0, 1 to VF 0, N, along with a reason code for 'completion of function level reset', or (3) a minimum function level reset time has elapsed. Here, the function level reset time may be the function level reset time value of a readiness time reporting capability related to the virtual functions VF 0, 1 to VF 0, N, or may be a value determined by system software/firmware.

After physical function 0 (PF 0) sets a virtual function enable bit, (1) a time of at least 1.0 seconds has elapsed, or (2) a function level reset message is received from physical function 0 (PF 0) with a reason code for 'virtual function enabled'.

Figure 6:
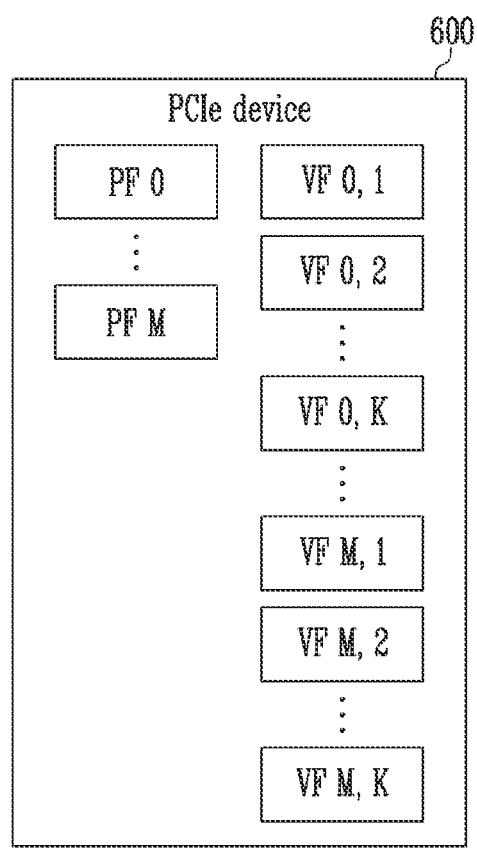
FIG. 6 illustrates an example of an SR-IOV capable PCIe device according to an embodiment of the present disclosure.

FIG. 6 illustrates an example of an SR-IOV capable PCIe device according to an embodiment of the present disclosure.

A PCIe device 600 illustrated in FIG. 6 may indicate the PCIe device 2000 illustrated in FIG. 1 or one of the PCIe devices 2000-1 to 2000-3 illustrated in FIGS. 2 and 3.

For example, FIG. 6 illustrates the PCIe device 600 to which SR-IOV capabilities are applied.

Referring to FIG. 6, the PCIe device 600 may include a plurality of physical functions PF 0 to PF M and a plurality of virtual functions VF 0, 1 to VF M, K associated with each of the plurality of physical functions PF 0 to PF M. In an embodiment, the configuration space, the register setup scheme, the error processing operation, and the function level reset operation for PCIe functions Function 0 to Function N, described above with reference to FIG. 4, may be applied to the plurality of physical functions PF 0 to PF M. Also, the configuration space for physical function 0 (PF 0), described above with reference to FIG. 5, may be applied to the plurality of physical functions PF 0 to PF M. Further, the configuration space, the error processing operation, and the reset operation for the virtual functions VF 0, 1 to VF 0, N, described above with reference to FIG. 5, may be applied to the plurality of virtual functions VF 0, 1 to VF M, K.

Each of the plurality of physical functions PF 0 to PF M may include SR-IOV capabilities. 0 or more virtual functions may be assigned to each of the plurality of physical functions PF 0 to PF M. The numbers of virtual functions assigned to respective physical functions may be different from each other.

When ARI capabilities are supported, the plurality of physical functions PF 0 to PF M and the plurality of virtual functions VF 0, 1 to VF M, K may be assigned to function groups.

In an embodiment, the plurality of physical functions PF 0 to PF M may be of the same device type. For example, the plurality of physical functions PF 0 to PF M may provide the same network device or the same storage device functionality.

In an embodiment, the plurality of physical functions PF 0 to PF M may be of different device types. For example, one of the plurality of physical functions PF 0 to PF M may indicate a network device, and another physical function may indicate an encryption device.

In the situation in which usage model dependency is present between device types such as virtual functions that are of a network device type, each system image may also require virtual functions that are of an encryption device type. SR-IOV capabilities may provide a method indicating such dependencies. The number of physical functions and the number of virtual functions may vary depending on the usage model requirements.

In an embodiment, the PCIe device 600 may support a maximum of 256 physical functions using alternative routing identifier (ARI) capabilities. The allocation of function numbers may vary depending on the implementation. The physical functions PF 0 to PF M may be related only to captured bus numbers of the PCIe device 600. The SR-IOV capable PCIe device 600 may use two or more bus numbers. The virtual functions VF 0, 1 to VF M, K may be related to any bus numbers (captured bus numbers and additional bus numbers configured using software) within the bus number range of the PCIe device 600. Usage of the multi-bus numbers enables the PCIe device 600 to support a large number of virtual functions (i.e., within a range up to a value obtained by subtracting bits used to identify intervening buses from the size of a routing ID space). Unless software configures a sufficient number of additional bus numbers, virtual functions implemented for the additional bus numbers may not be indicated.

Figure 7:
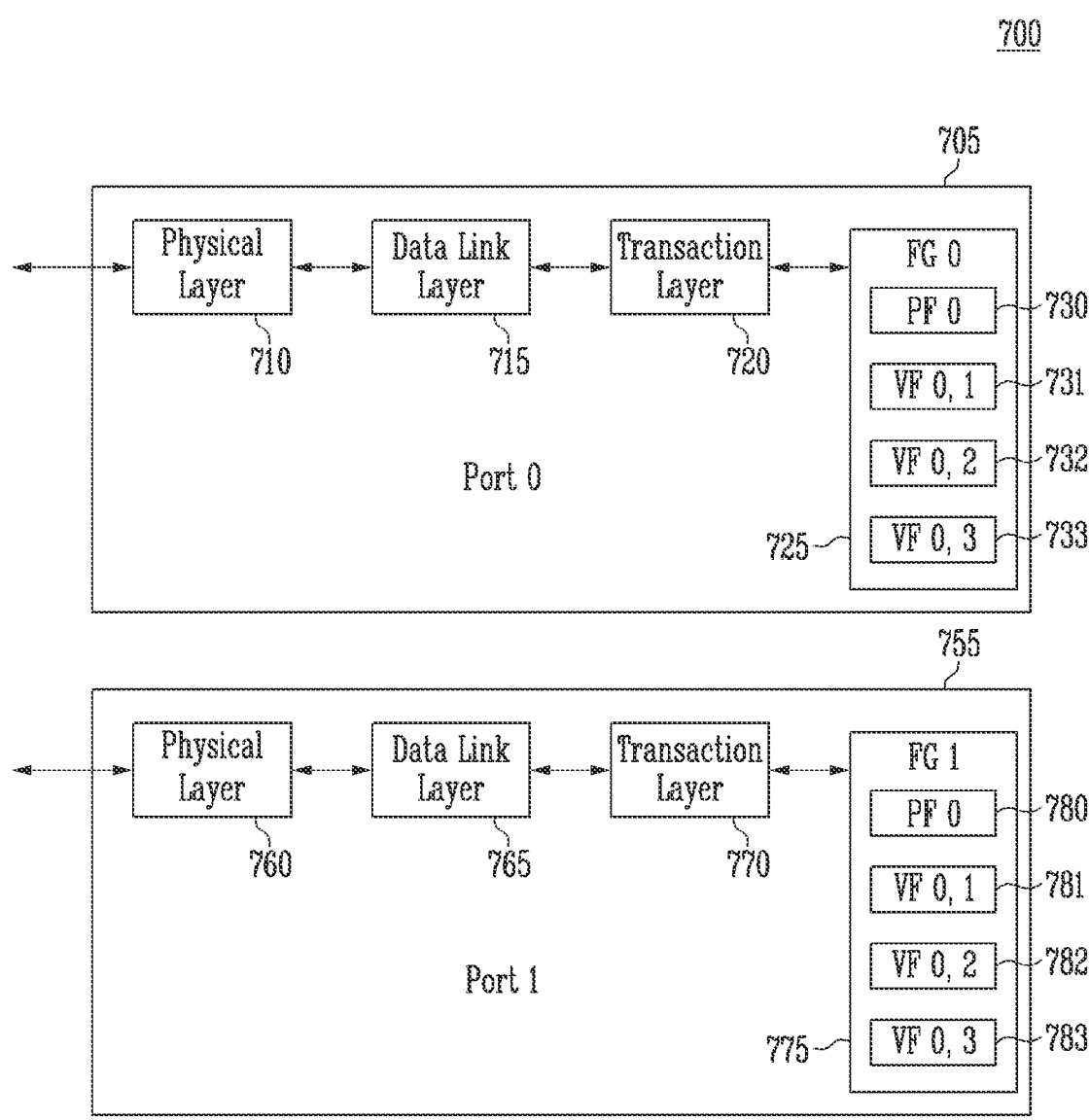
FIG. 7 is a diagram illustrating a PCIe device having a multi-port structure according to an embodiment of the present disclosure.

FIG. 7 is a diagram illustrating a PCIe device having a multi-port structure according to an embodiment of the present disclosure.

The PCIe device having a multi-port structure may include a plurality of ports. Referring to FIG. 7, a PCIe device 700 may include port 0 705 and port 1 755. However, this is only an example, and a PCIe device having a multi-port structure including three or more ports may also be implemented.

In the PCIe device having a multi-port structure, individual PCIe hierarchies for respective ports may be implemented. As illustrated in FIG. 7, port 0 705 may include a physical layer 710, a data link layer 715, and a transaction layer 720. Also, port 0 705 may support multiples functions. In this case, port 0 705 may include function group (FG) 0 725. Function group 0 725 may include, as an example, one physical function 730 and virtual functions 731, 732, and 733 corresponding thereto.

Further, port 1 755 may include a physical layer 760, a data link layer 765, and a transaction layer 770. Also, port 1 755 may support multiple functions. In this case, port 1 755 may include function group (FG) 1 775. Function group 1 775 may include, as an example, one physical function 780 and virtual functions 781, 782, and 783 corresponding thereto.

Each of the physical layers 710 and 760 may include all circuits for interface operation, including a driver and input buffer, a parallel-serial and serial-parallel conversion circuit, a PLL, and an impedance matching circuit. Furthermore, each of the physical layers 710 and 760 may include logical functions related to interface initialization and maintenance. Each of the physical layers 710 and 760 may function to convert information received from the data link layer into an appropriate serial format and to transmit the converted information through a PCI Express link at a frequency and a bandwidth compatible with a device coupled to the other end of the link.

The data link layers 715 and 765 may correspond to an intermediate layer of a PCIe hierarchy, and may function as an intermediate stage between the transaction layers 720 and 770 and the physical layers 710 and 760. The principal characteristics of the data link layer may be error detection and error correction. Accordingly, link management and data integrity may be implemented through the data link layer. That is, the primary purpose of the data link layers 715 and 765 may be to stably transfer packets through the PCIe link, and a sequence number and a CRC may be added to each TLP.

A transmitting end of the data link layer may permit TLPs combined by the transaction layer, calculates and applies data protection code and a TLP sequence number, and transfers the TLPs to the physical layer for transmission through a link. A receiving end of the data link layer checks integrity of received TLPs, and transfers the TLPs to the transaction layer for additional processing. When a TLP error is detected, the transaction layer requests retransmission of TLPs until it is determined that information is accurately received or that link failure has occurred.

The data link layer may also generate and consume packets to be used for a link management function. In order to distinguish these packets from the packets TLPs used in the transaction layer, the term "data link layer packet (DLLP)" is used to describe a packet that is generated and consumed by the data link layer.

Each of the transaction layers 720 and 770 may correspond to an upper layer in the PCIe hierarchy. The main characteristics of the transaction layer may be an assembly and a disassembly of transaction layer packets (TLPs). TLPs may be used to communicate transactions such as read and write transactions, as well as a specific type of event.

All request packets requiring response packets may be implemented using split transactions. In each of ten packets, a unique identifier enabling a response packet to be sent to a correct sender may be designated. A packet format supports different types of address designation methods depending on the transaction type (memory, I/O, configuration, and message). Packets may have attributes such as no snoop, relaxed ordering, or ID-based ordering (IDO). The transaction layer substantially processes commands.

As illustrated in FIG. 7, the PCIe device including a multi-port structure may include a plurality of ports, each having one or more functions. In this case, each port may support multiple functions. When multiples functions are used for each port in the PCIe device including a multi-port structure, the number of functions required per port needs to be determined. In this case, several problems may occur.

For example, in a fail-over scheme in which port 0 705 is mainly used, and port 1 755 is subsidiarily used when a fault or an error occurs in port 0 705, the same number of functions need to be included in port 0 705 and port 1 755. However, in schemes other than the fail-over scheme, port 0 705 and port 1 755 do not need to include the same number of functions. When port 0 705 is mainly used and port 1 755 is subsidiarily used, port 1 755 may need only one function. When it is desired to design a PCI device satisfying all of these requirements, there may occur the case in which some ports include unnecessary functions. This may be the cause of unnecessarily arranging resources for the PCIe device.

In accordance with the PCIe device according to an embodiment of the present disclosure, variably assignable functions may be included in each of the plurality of ports. Accordingly, the PCIe device having a multi-port structure may efficiently use device resources for functions. Below, a description will be made in detail with reference to FIG. 8.

Figure 8:
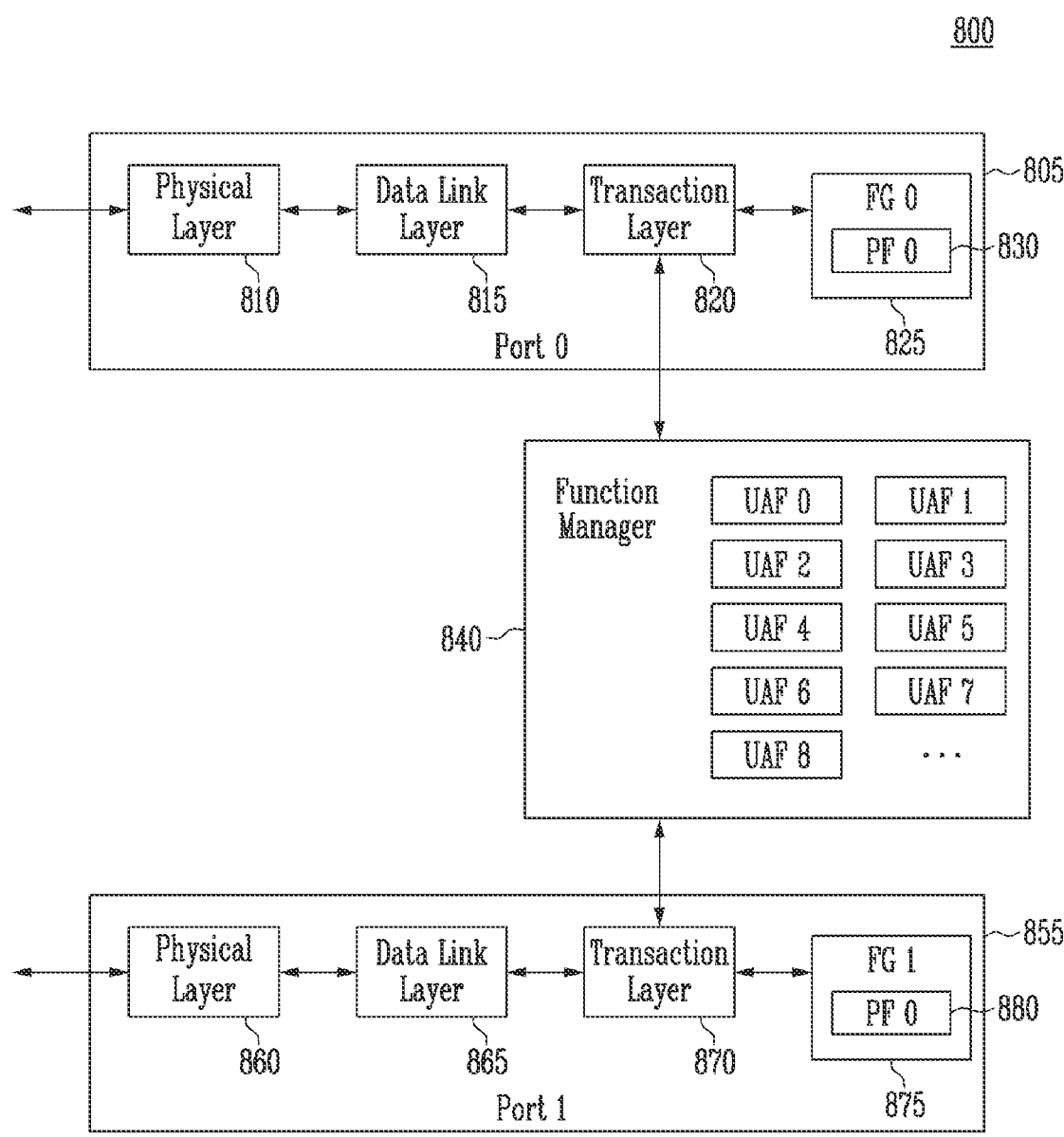
FIG. 8 is a diagram illustrating a PCIe device according to an embodiment of the present disclosure.

FIG. 8 is a diagram illustrating a PCIe device according to an embodiment of the present disclosure.

Referring to FIG. 8, the PCIe device according to an embodiment of the present disclosure may include port 0 (i.e., a first port) 805, port 1 (i.e., a second port) 855, and a function manager 840. According to illustration in FIG. 8, the PCIe device including two ports is illustrated, but this is only an example, and the present disclosure is not limited thereto. According to the present disclosure, a PCIe device having a multi-port structure including three or more ports may also be implemented. However, for convenience of description, a description will be made based on the PCIe device including two ports.

In the PCIe device having a multi-port structure, individual PCIe hierarchies for respective ports may be implemented. As illustrated in FIG. 8, port 0 805 may include a physical layer 810, a data link layer 815, and a transaction layer 820. Also, port 0 805 may support multiple functions. In this case, port 0 805 may include function group 0 825. Referring to FIG. 8, function group 0 825 is illustrated as including one physical function 830 by way of example.

However, this is only an example, and an additional physical function and virtual functions may be included in function group 0 825. The transaction layer 820 in port 0 may communicate with the physical function 830 in function group 0 825 included in port 0. Also, the transaction layer 820 in port 0 may communicate with the function manager 840.

Further, port 1 855 may include a physical layer 860, a data link layer 865, and a transaction layer 870. Also, port 1 855 may support multiple functions. In this case, port 1 855 may include function group 1 875. Function group 1 875 may include, for example, one physical function 880. However, this is only an example, and an additional physical function and virtual functions may be included in function group 1 875. The transaction layer 870 in port 1 may communicate with the physical function 880 in function group 1 875 included in port 1. Also, the transaction layer 870 in port 1 may communicate with the function manager 840.

The function manager 840 may include a plurality of unassigned functions UAF0 to UAF8. The unassigned functions UAF0 to UAF8 included in the function manager 840 may be functions that are assigned neither to port 0 805 nor to port 1 855. In an embodiment, the unassigned functions UAF0 to UAF8 may be physical functions. In an embodiment, the unassigned functions UAF0 to UAF8 may be virtual functions. In an embodiment, at least some of the unassigned functions UAF0 to UAF8 may be physical functions, and the remaining functions may be virtual functions.

In an embodiment, a configuration space for the unassigned functions UAF0 to UAF8 may include a PCIe power capability structure. In an example, the PCIe capability structure may include a PCI express capabilities register, a device capabilities register, a device control register, a device status register, a link capabilities register, a link control register, a link status register, a slot capabilities register, a slot control register, a slot status register, a root control register, a root capabilities register, a root status register, a device capabilities 2 register, a device control 2 register, a device status 2 register, a link capabilities 2 register, a link control 2 register, a link status 2 register, a slot capabilities 2 register, a slot control 2 register, a slot status 2 register, a root control 2 register, a root capabilities 2 register, a root status 2 register, etc.

The PCIe capability register for the unassigned functions UAF 0 to UAF 8 of the function manager 840 may identify PCIe device function types and associated capabilities. In accordance with an embodiment of the present disclosure, a specific field of the PCI capability register for unassigned functions UAF 0 to UAF 8 of the function manager 840 may indicate port assignment information. In the state in which a function is unassigned, a specific field of the PCIe capability register indicating the port assignment information may have a null value or a value indicating unassignment. When a port is assigned to an unassigned function, the port assignment information of the corresponding function may have a value indicating an assigned port.

The function manager 840 may selectively assign at least one of the unassigned functions UAF 0 to UAF 8 to port 0 805 and port 1 855.

Accordingly, the host may variably assign the unassigned functions to the plurality of ports. Accordingly, in design of a PCIe device, when the PCIe device is designed only in the state in which the number of fixed functions (e.g., 830) only for port 0 805, the number of fixed functions (e.g., 880) only for port 1 855, and the total number of unassigned functions UAF 0 to UAF 8 belonging to the function manager are defined, functions required per port in the subsequent operation of the PCIe device 800 may be flexibly assigned in response to a command from the host. Accordingly, the use of unnecessary resources for functions arranged in each port may be minimized.

Figure 9:
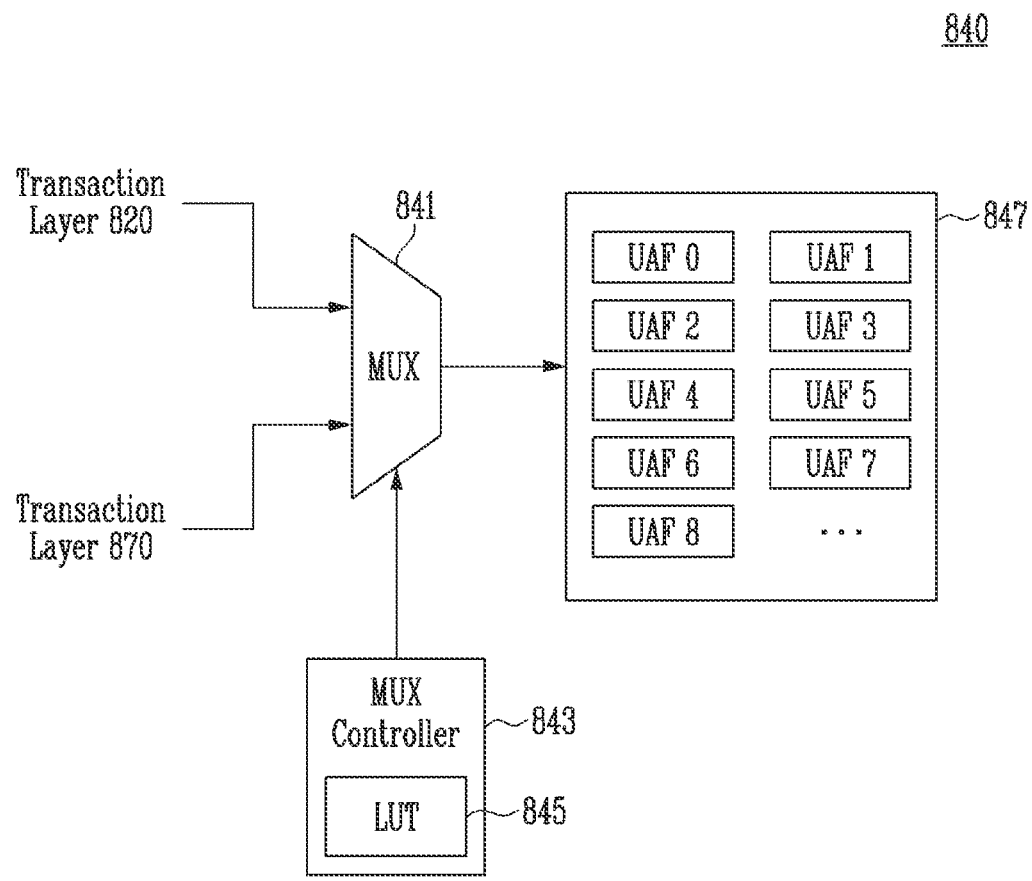
FIG. 9 is a diagram illustrating a function manager included in a PCIe device according to an embodiment of the present disclosure.

FIG. 9 is a diagram illustrating a function manager included in a PCIe device according to an embodiment of the present disclosure.

Referring to FIG. 9, a function manager 840 may include a multiplexer (MUX) 841, a variable function group 847, and a multiplexer (MUX) controller 843. The multiplexer 841 may couple one of the transaction layer 820 of port 0 805 and the transaction layer 870 of port 1 855 to one of a plurality of functions in the variable function group 847. More specifically, the multiplexer 841 may couple one of the transaction layer 820 and the transaction layer 870 to one of the plurality of functions in the variable function group 847 in response to a control signal from the MUX controller 843.

The variable function group 847 may include a plurality of variable functions. Initially, all of the plurality of variable functions belonging to the variable function group 847 may be in an unassigned state. As illustrated in FIG. 9, the variable function group 847 may include a plurality of unassigned functions UAF 0 to UAF 8 that are initially in an unassigned state. Also, the MUX controller 843 may include a lookup table (LUT) 845 including information for controlling the multiplexer 841. When at least one unassigned function in the variable function group 847 is assigned to a specific port, the lookup table 845 may include information for identifying the assigned function and the specific port corresponding thereto. Hereinafter, the operation of the function manager 840 according to the present disclosure will be described in detail with reference to FIGS. 10A to 11B.

Figure 10A:
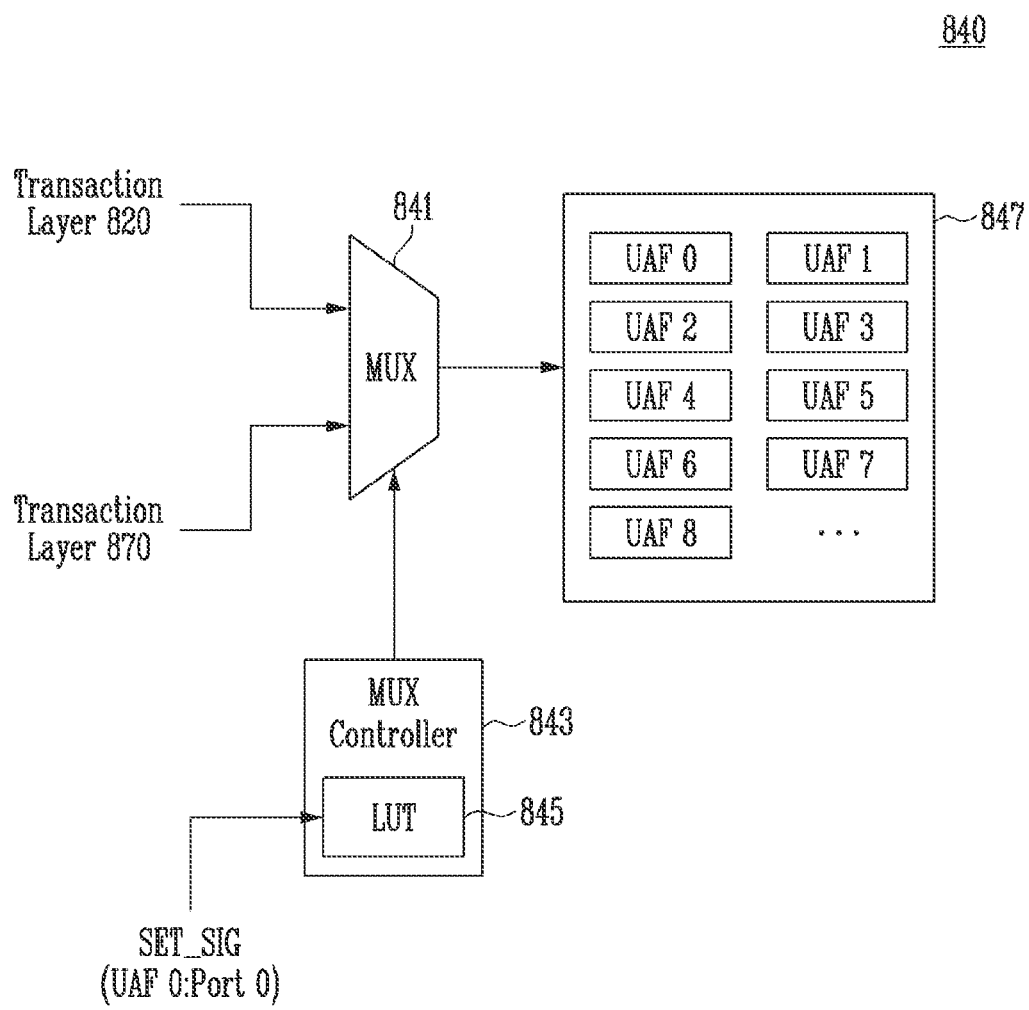
FIGS. 10A and 10B are diagrams illustrating an operation of assigning an unassigned function to port 0 according to an embodiment of the present disclosure.
Figure 10B:
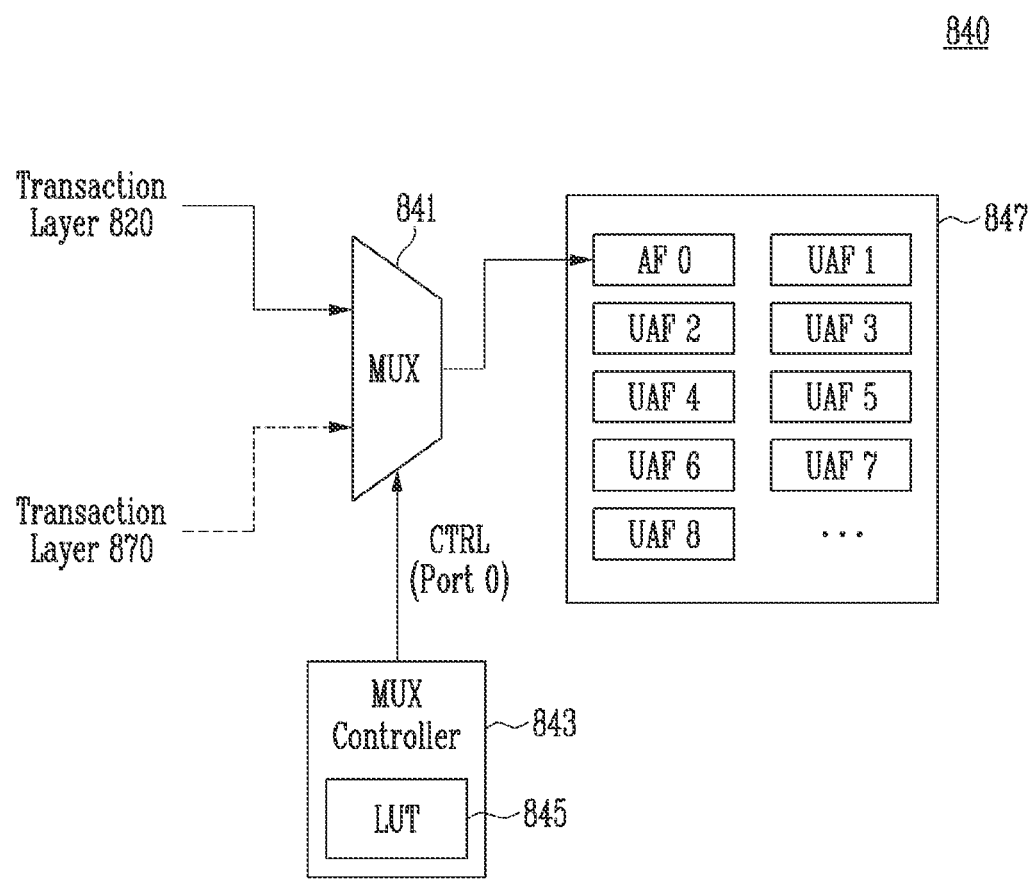

FIGS. 10A and 10B are diagrams illustrating an operation of assigning an unassigned function to port 0 according to an embodiment of the present disclosure. In detail, FIG. 10A illustrates an operation of assigning an unassigned function UAF 0 to port 0 805 and FIG. 10B illustrates the operation of function AF 0 assigned to port 0.

Referring to FIG. 10A, the function manager 840 of the PCIe device may determine that the unassigned function UAF 0, among the unassigned functions UAF 0 to UAF 8 belonging to the variable function group 847, is to be assigned to port 0 805. This determination may be internally performed by the PCIe device 800 regardless of a host 1000, or may be performed in response to a request from the host 1000 in some cases. When the operation of assigning the unassigned functions UAF 0 to UAF 8 belonging to the variable function group 847 to a specific port is performed in response to the request from the host 1000, the host 1000 may transfer function assignment information required for assigning the unassigned functions to each port to the PCIe device 800. In this case, the function assignment information may be transferred from the host 1000 to the PCIe device 800 through various schemes, such as vendor-defined messages (VDM), a specific vendor's unique capability, NVMe Admin commands, or MCTP PCIe VDM transport binding protocol. In this case, the function assignment information may include data identifying unassigned functions that are the targets of assignment and data indicating ports to which the unassigned functions are to be assigned.

When it is determined that, among the unassigned functions UAF 0 to UAF 8 belonging to the variable function group 847, the unassigned function UAF 0 is to be assigned to port 0 805, the function manager 840 may assign the unassigned function UAF 0 to port 0 805 when port 0 805 is in a reset state. In detail, a set signal SET_SIG for controlling the unassigned function UAF 0 to be assigned to port 0 805 may be applied to the lookup table 845 of the MUX controller 843. In response to the set signal SET_SIG, information in the lookup table 845 may be updated. That is, the information in the lookup table 845 may be undated to include information indicating that the unassigned function UAF 0 of the variable function group 847 has been assigned to port 0 805.

As described above, a specific field of the PCI capability register for the unassigned functions UAF 0 to UAF 8 of the function manager 840 may indicate port assignment information. In the state in which the function UAF 0 is unassigned, a specific field of the PCIe capability register indicating the port assignment information may have a null value or a value indicating unassignment. When a port is assigned to the unassigned function, the specific field of the PCIe capability register indicating port assignment information for the unassigned function UAF 0 may be updated to a value indicating port 0. Accordingly, the unassigned function UAF 0 may be updated to the assigned function AF 0.

Referring to FIG. 10B, illustrated is the operation of an assigned function AF_0 after an unassigned function UAF 0 is assigned to port 0 805 and then the unassigned function UAF 0 is updated to the assigned function AF 0. When the host 1000 desires to operate the assigned function AF 0 through port 0 805 of the PCIe device 800, the MUX controller 843 refers to the lookup table 845. Based on information indicating that the assigned function AF 0 has been assigned to port 0 805, the MUX controller 843 may output control signal CTRL for controlling the multiplexer 841 to couple the transaction layer 820, belonging to port 0 805 between the transaction layer 820 and the transaction layer 870, to the assigned function AF0 in the variable function group 847.

Figure 11A:
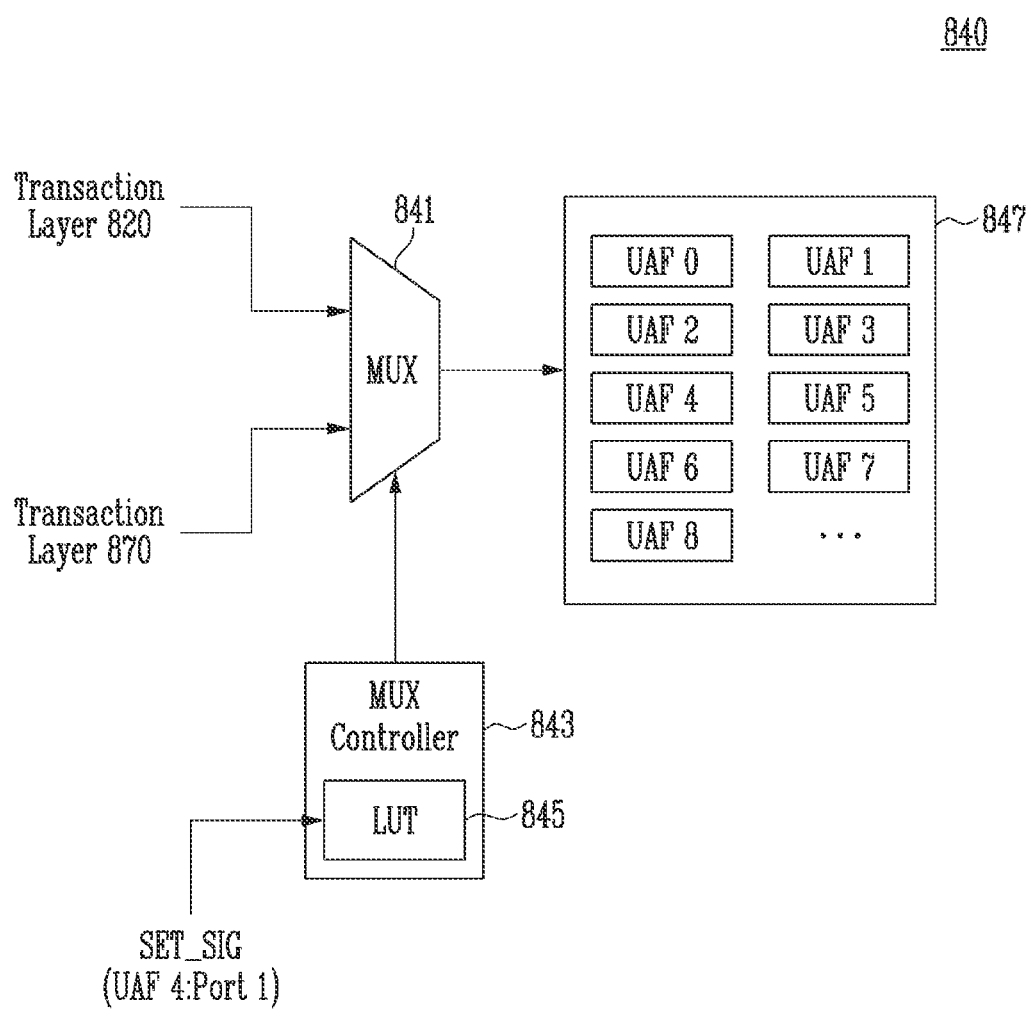
FIGS. 11A and 11B are diagrams illustrating an operation of assigning an unassigned function to port 1 according to an embodiment of the present disclosure.
Figure 11B:
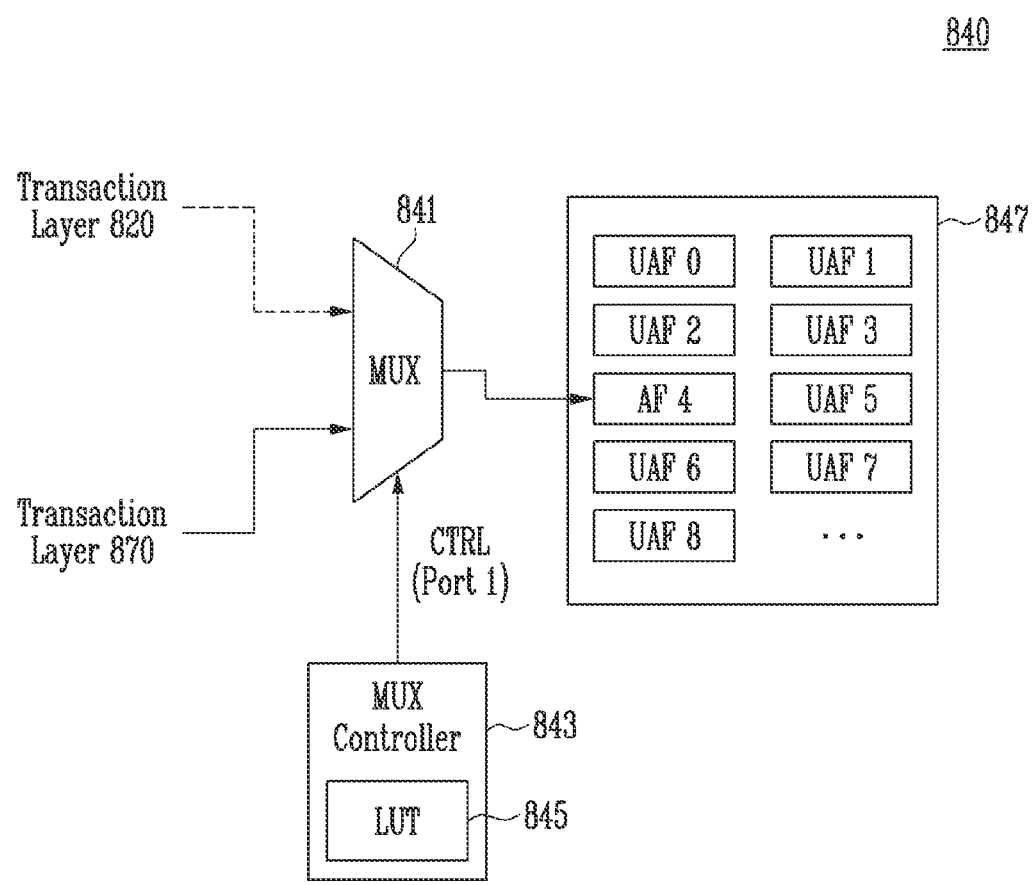

FIGS. 11A and 11B are diagrams illustrating an operation of assigning an unassigned function to port 1 according to an embodiment of the present disclosure.

In detail, FIG. 11A illustrates an operation of assigning an unassigned function UAF 4 to port 1 855 and FIG. 11B illustrates the operation of function AF 4 assigned to port 1.

Referring to FIG. 11A, the function manager 840 of the PCIe device may determine that the unassigned function UAF 4, among the unassigned functions UAF 0 to UAF 8 belonging to the variable function group 847, is to be assigned to port 1 855. As described above, this determination may be internally performed by the PCIe device 800 regardless of a host 1000, or may be performed in response to a request from the host 1000 in some cases.

When it is determined that, among the unassigned functions UAF 0 to UAF 8 belonging to the variable function group 847, the unassigned function UAF 4 is to be assigned to port 1 855, the function manager 840 may assign the unassigned function UAF 4 to port 1 855 when port 1 855 is in a reset state. In detail, a set signal SET_SIG for controlling the unassigned function UAF 4 to be assigned to port 1 855 may be applied to the lookup table 845 of the MUX controller 843. In response to the set signal SET_SIG, information in the lookup table 845 may be updated. That is, the information in the lookup table 845 may be updated to include information indicating that the unassigned function UAF 4 of the variable function group 847 has been assigned to port 1 855.

As described above, a specific field of the PCI capability register for the unassigned functions UAF 0 to UAF 8 of the function manager 840 may indicate port assignment information. In the state in which the function UAF 4 is unassigned, a specific field of the PCIe capability register indicating the port assignment information may have a null value or a value indicating unassignment. When a port is assigned to the unassigned function, the specific field of the PCIe capability register indicating port assignment information for the unassigned function UAF 4 may be updated to a value indicating port 1. Accordingly, the unassigned function UAF 4 may be updated to the assigned function AF 4.

Referring to FIG. 11B, illustrated is the operation of an assigned function AF_4 after an unassigned function UAF 4 is assigned to port 1 855 and then the unassigned function UAF 4 is updated to the assigned function AF 4. When the host 1000 desires to operate the assigned function AF 4 through port 1 855 of the PCIe device 800, the MUX controller 843 refers to the lookup table 845. Based on information indicating that the assigned function AF 4 has been assigned to port 1 855, the MUX controller 843 may output control signal CTRL for controlling the multiplexer 841 to couple the transaction layer 870, belonging to port 1 855 between the transaction layer 820 and the transaction layer 870, to the assigned function AF4 in the variable function group 847.

As described above, the PCIe device according to an embodiment of the present disclosure may assign unassigned functions in the variable function group to a plurality of ports. Accordingly, in design of a PCIe device, when the PCIe device is designed only in the state in which the number of fixed functions (e.g., 830) only for port 0 805, the number of fixed functions (e.g., 880) only for port 1 855, and the total number of unassigned functions UAF 0 to UAF 8 belonging to the function manager are defined, functions required per port in the subsequent operation of the PCIe device 800 may be flexibly assigned. Accordingly, the use of unnecessary resources for functions arranged in each port may be minimized.

Figure 12:
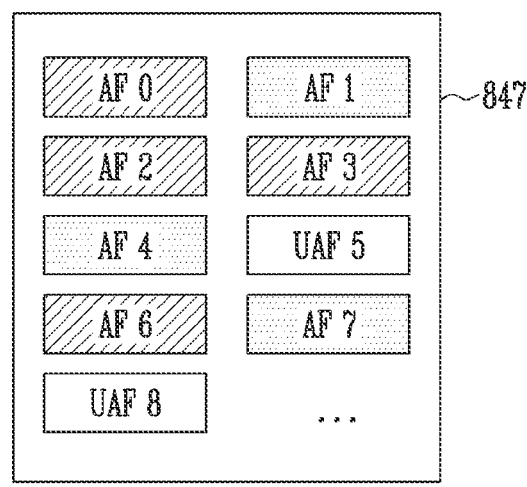
FIG. 12 is a diagram illustrating an example of the state in which functions included in a function manager are assigned according to an embodiment of the present disclosure.

FIG. 12 is a diagram illustrating an example of the state in which functions included in a function manager are assigned according to an embodiment of the present disclosure. In accordance with the present disclosure, each of a plurality of functions belonging to the variable function group 847 may belong to one of three states. Referring to the example of FIG. 12, the variable function group 847 includes hatched functions AF 0, AF 2, AF 3, and AF 6, which are assigned to port 0, shaded functions AF 1, AF 4, and AF 7, which are assigned to port 1, and unassigned functions UAF 5 and UAF 8.

Figure 13:
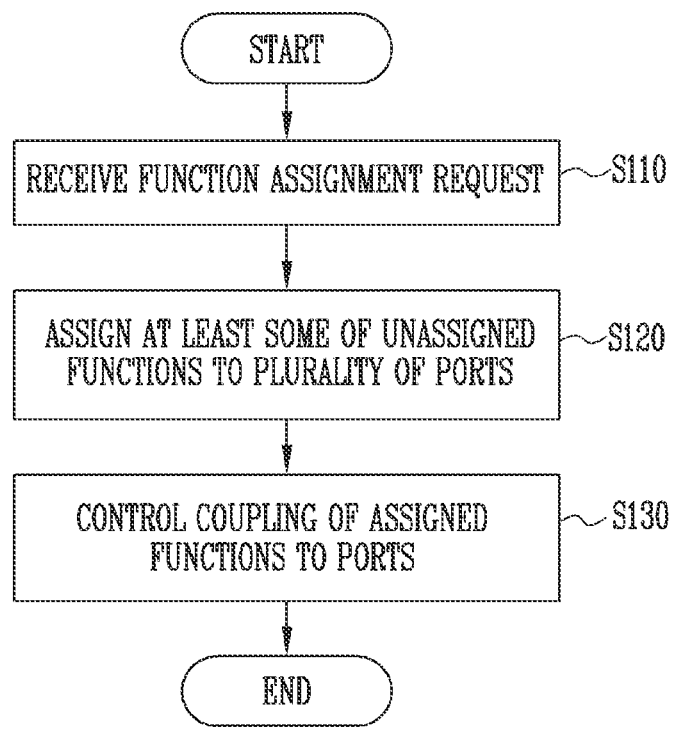
FIG. 13 is a flowchart illustrating a method of operating a PCIe device according to an embodiment of the present disclosure.

FIG. 13 is a flowchart illustrating a method of operating a PCIe device according to an embodiment of the present disclosure.

Referring to FIG. 13, the method of operating a PCIe device according to an embodiment of the present disclosure may include operation S110 of receiving a function assignment request from a host 1000, operation S120 of assigning at least some of the unassigned functions to a plurality of ports, and operation S130 of controlling coupling of the assigned functions to the ports.

At operation S110, a PCIe device 800 may receive a function assignment request from the host 1000. The function assignment request may include data identifying unassigned functions that are the targets of assignment and data indicating ports to which the unassigned functions are to be assigned. The PCIe device 800 may receive a function assignment request from the host 1000 through various schemes, such as vendor-defined messages (VDM), a specific vendor's unique capability, NVMe Admin commands, or MCTP PCIe VDM transport binding protocol. Meanwhile, operation S110 may be an optional component, where the PCIe device 800 may internally assign functions in a variable function group to respective ports without receiving a function assignment request from the host 1000.

At operation S120, as described above with reference to FIGS. 10A and 11A, unassigned functions may be assigned to respective ports. As described above, the function manager 840 of the PCIe device 800 may apply a set signal SET_SIG for controlling unassigned functions to be assigned to respective ports to the lookup table 845 of the MUX controller 843. In response to the set signal SET_SIG, information in the lookup table 845 may be updated. Furthermore, a specific field of a PCIe capability register indicating port assignment information for unassigned functions may be updated to a value indicating the corresponding port.

At operation S130, as described above with reference to FIGS. 10B and 11B, assigned functions may be coupled to respective ports. As described above, when the host 1000 desires to operate a function, assigned to a specific port, through the specific port, the MUX controller 843 may couple the function to a transaction layer corresponding thereto with reference to the lookup table 845.

The present disclosure may provide an interface device having a multi-port structure, which can efficiently use resources for functions corresponding to each port, and a method of operating the interface device.

While various embodiments have been described above, it will be understood to those skilled in the art that the embodiments described are examples only. Accordingly, the interface device and the method for operating an interface device described herein should not be limited based on the described embodiments. Furthermore, the embodiments may be combined to form additional embodiments.

What is claimed is:

1. An interface device, comprising:
a first port including a first physical function and configured to enable communication with a host;
a second port including a second physical function and configured to enable communication with the host; and
a function manager including a plurality of variable functions, configured to:
assign at least one first variable function coupled neither to the first port nor to the second port, among the plurality of variable functions, to the first port,
assign at least one second variable function coupled neither to the first port nor to the second port, among the plurality of variable functions, to the second port,
control the first physical function and the at least one first variable function to communicate with the host through the first port, and
control the second physical function and the at least one second variable function to communicate with the host through the second port,
wherein the first physical function is configured to manage a first link shared by the first physical function and the at least one first variable function, and
wherein the second physical function is configured to manage a second link shared by the second physical function and the at least one second variable function.

2. The interface device according to claim 1, wherein the function manager comprises:
a multiplexer configured to couple the at least one first variable function to the first port, and couple the at least second first variable function to the second port;
a multiplexer controller configured to control an operation of the multiplexer; and
a variable function group including the plurality of variable functions.

3. The interface device according to claim 2, wherein the multiplexer controller comprises a lookup table indicating information for identifying a relationship between the at least one first variable function and the first port, and a relationship between the at least one second variable function and the second port.

4. The interface device according to claim 3, wherein the variable function group comprises a configuration space including registers configured to form each of the plurality of variable functions.

5. The interface device according to claim 4, wherein each of the registers included in the configuration space includes a field indicating port assignment information for a corresponding variable function of the plurality of variable functions.

6. The interface device according to claim 4, wherein the function manager is configured to update port assignment information corresponding to the at least one first variable function and the at least one second variable function to a value indicating the first port and the second port, and
update the lookup table to indicate information for identifying a relationship between the at least one first variable function and the first port and a relationship between the at least one second variable function and the second port.

7. The interface device according to claim 1,
wherein the first port includes a first physical layer, a first data link layer, and a first transaction layer, and
wherein the second port includes a second physical layer, a second data link layer, and a second transaction layer.

8. The interface device according to claim 1, wherein the at least one first variable function and the at least one second variable function are physical functions.

9. The interface device according to claim 1, wherein the at least one first variable function and the at least one second variable function are virtual functions.

10. The interface device according to claim 1, wherein the at least one first variable function and the at least one second variable function are assigned in response to a port assignment request received from the host.

11. The interface device according to claim 10, wherein the port assignment request includes function identification information for identifying the at least one first variable function and the at least one second variable function that are targets of assignment, among the plurality of variable functions, and information indicating ports to which the identified variable functions are assigned.

12. A method of operating an interface device for communicating a plurality of variable functions with a host through a plurality of ports, the method comprising:
enabling first and second ports of the plurality of ports to communicate with the host;
determining at least one variable function coupled to none of the plurality of ports among the plurality of variable functions;
assigning by a function manager the at least one variable function presently coupled neither to the first port nor the second port to a selected port of the plurality of ports in response to the determination, wherein the selected port includes one of the first and second ports and includes a physical function; and
controlling by the function manager the physical function and the at least one variable function assigned to the selected port to communicate with the host through the selected port, wherein the physical function is configured to manage a link shared by the physical function and the at least one variable function assigned to the selected port.

13. The method according to claim 12, wherein:

the interface device comprises a configuration space including registers configured to form each of the plurality of variable functions, and the assigning of the at least one variable function to the selected port comprises:

updating port assignment information, which corresponds to the at least one variable function and is included in the configuration space, to a value indicating the selected port; and updating a lookup table indicating information for identifying a relationship between the at least one variable function and the selected port.

14. The method according to claim 13, wherein the controlling the assigned function to communicate with the host through the selected port comprises:

identifying the assigned function and the selected port with reference to the lookup table; and coupling the selected port to the at least one variable function assigned to the selected port.

15. The method according to claim 12, further comprising receiving, from the host, a port assignment request for identifying the at least one variable function and the selected port to be assigned to the at least one variable function, before the determining.

16. The method according to claim 15, wherein determining that the at least one variable function, among the plurality of variable functions, is to be assigned to the selected port of the plurality of ports is performed after the port assignment request is received.

* * * * *